United States Patent
Matsuda

(10) Patent No.: US 10,546,867 B2
(45) Date of Patent: Jan. 28, 2020

(54) METHOD FOR MANUFACTURING SEMICONDUCTOR DEVICE AND SEMICONDUCTOR DEVICE

(71) Applicant: Toshiba Memory Corporation, Minato-ku (JP)

(72) Inventor: Yuya Matsuda, Mie (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/908,006

(22) Filed: Feb. 28, 2018

(65) Prior Publication Data

US 2019/0067310 A1 Feb. 28, 2019

(30) Foreign Application Priority Data

Aug. 28, 2017 (JP) .................. 2017-163695

(51) Int. Cl.
*H01L 21/8238* (2006.01)
*H01L 27/11556* (2017.01)
*H01L 27/11524* (2017.01)
*H01L 27/1157* (2017.01)
*H01L 27/11582* (2017.01)
(Continued)

(52) U.S. Cl.
CPC .... *H01L 27/11556* (2013.01); *H01L 27/1157* (2013.01); *H01L 27/11524* (2013.01); *H01L 27/11573* (2013.01); *H01L 27/11575* (2013.01); *H01L 27/11582* (2013.01); *H01L 21/823871* (2013.01); *H01L 21/823885* (2013.01); *H01L 27/11529* (2013.01); *H01L 27/11534* (2013.01); *H01L 27/11548* (2013.01)

(58) Field of Classification Search
CPC ............. H01L 23/535; H01L 21/76895; H01L 21/76877–76883; H01L 21/76802–76817; H01L 2924/1451; H01L 27/115–27/11597; H01L 27/11526–27/11548; G11C 16/00–349
See application file for complete search history.

(56) References Cited

U.S. PATENT DOCUMENTS 7,936,004 B2    5/2011   Kito et al.
8,278,695 B2   10/2012   Kidoh et al.
(Continued)

FOREIGN PATENT DOCUMENTS

JP    2007-266143    10/2007
JP    2008-72051      3/2008
JP    2011-187794     9/2011

*Primary Examiner* — Jarrett J Stark
(74) *Attorney, Agent, or Firm* — Oblon, McClelland, Maier & Neustadt, L.L.P.

(57) ABSTRACT

According to one embodiment, a method for manufacturing a semiconductor device includes forming a first metal material inside the first holes; forming a plurality of metal layers on the first region, the metal layers being stacked with an insulator interposed, the metal layers including a plurality of terrace portions arranged in a staircase configuration with a level difference; forming a second insulating layer on the first insulating layer and on the terrace portions; simultaneously forming a second hole and a plurality of third holes piercing the second insulating layer, the second hole reaching the first metal material, the third holes reaching the terrace portions; and forming a second metal material inside the second hole and inside the third holes.

13 Claims, 27 Drawing Sheets

(51) Int. Cl.
  *H01L 27/11575* (2017.01)
  *H01L 27/11573* (2017.01)
  H01L 27/11534 (2017.01)
  H01L 27/11548 (2017.01)
  H01L 27/11529 (2017.01)

(56) References Cited

U.S. PATENT DOCUMENTS

| | | |
|---|---|---|
| 8,338,882 B2 | 12/2012 | Tanaka et al. |
| 2007/0252201 A1* | 11/2007 | Kito .................... H01L 21/8221 257/331 |
| 2011/0284946 A1* | 11/2011 | Kiyotoshi ......... H01L 27/11565 257/324 |
| 2015/0236038 A1* | 8/2015 | Pachamuthu ..... H01L 27/11582 257/326 |
| 2015/0262871 A1* | 9/2015 | Lee .................... H01L 21/76816 257/774 |
| 2016/0211363 A1* | 7/2016 | Park ................. H01L 29/66825 |
| 2016/0322374 A1* | 11/2016 | Sano ................. H01L 21/31111 |
| 2016/0322381 A1* | 11/2016 | Liu .................... H01L 27/11573 |
| 2016/0351497 A1* | 12/2016 | Peri ..................... H01L 23/5226 |
| 2017/0186767 A1* | 6/2017 | Baek ............... H01L 27/11565 |
| 2018/0247954 A1* | 8/2018 | Amano ............ H01L 21/02186 |
| 2019/0006384 A1* | 1/2019 | Iwasaki ............ H01L 27/11582 |

\* cited by examiner

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2017-163695, filed on Aug. 28, 2017; the entire contents of which are incorporated herein by reference.

FIELD

Embodiments described herein relate generally to a method for manufacturing a semiconductor device and a semiconductor device.

BACKGROUND

A method for manufacturing a device has been proposed in which the device includes a memory cell array having a three-dimensional structure and a CMOS (complementary metal-oxide-semiconductor) transistor formed on the same substrate at the periphery of the memory cell array, and the contacts for the memory cell array and the CMOS transistor are formed simultaneously.

DETAILED DESCRIPTION

Figure 1:
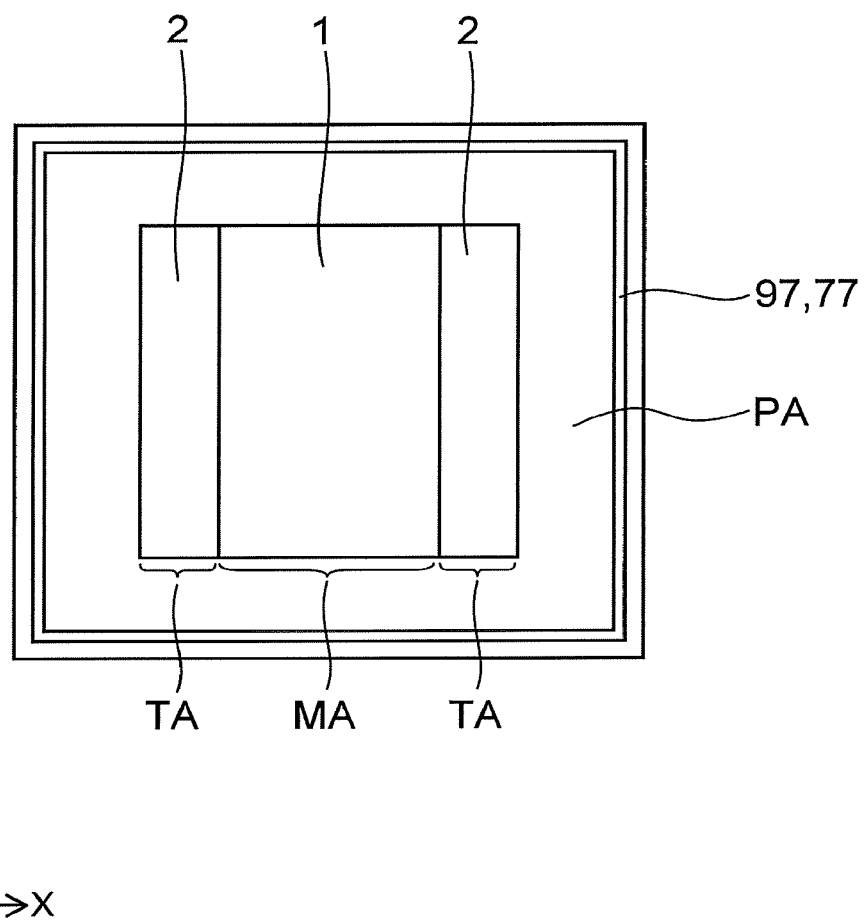
FIG. 1 is a schematic view showing a planar layout of a semiconductor device of an embodiment.

According to one embodiment, a method for manufacturing a semiconductor device includes forming a transistor in a second region of a substrate. The substrate includes a first region and the second region. The second region is at a periphery of the first region. The transistor includes an active region and a gate electrode. The method includes forming a first insulating layer on the second region, the first insulating layer covering the transistor. The method includes forming a plurality of first holes piercing the first insulating layer, and reaching the active region and the gate electrode. The method includes forming a first metal material inside the first holes. The method includes forming a plurality of metal layers on the first region, the metal layers being stacked with an insulator interposed, the metal layers including a plurality of terrace portions arranged in a staircase configuration with a level difference. The method includes forming a second insulating layer on the first insulating layer and on the terrace portions. The method includes simultaneously forming a second hole and a plurality of third holes piercing the second insulating layer, the second hole reaching the first metal material, the third holes reaching the terrace portions. The method includes forming a second metal material inside the second hole and inside the third holes.

Hereinafter, embodiments will be described with reference to the drawings. Incidentally, in the respective drawings, the same components are denoted by the same reference numerals.

In an embodiment, for example, a semiconductor memory device that includes a memory cell array having a three-dimensional structure is described as a semiconductor device.

FIG. 1 is a schematic view showing the planar layout of the semiconductor device of the embodiment.

One chip or substrate includes a memory region MA, a terrace region (or a staircase region) TA, and a peripheral region PA.

A memory cell array 1 is provided in the memory region MA. A staircase portion 2 is provided in the terrace region TA. A circuit that controls the memory cell array 1 is provided in the peripheral region PA. Edge seal portions 97 and 77 that protect the chip when performing the dicing cut of the chip are further provided outside the circuit. The memory cell array 1, the staircase portion 2, the circuit, and the edge seal portions 97 and 77 are provided on the same substrate.

Figure 2:
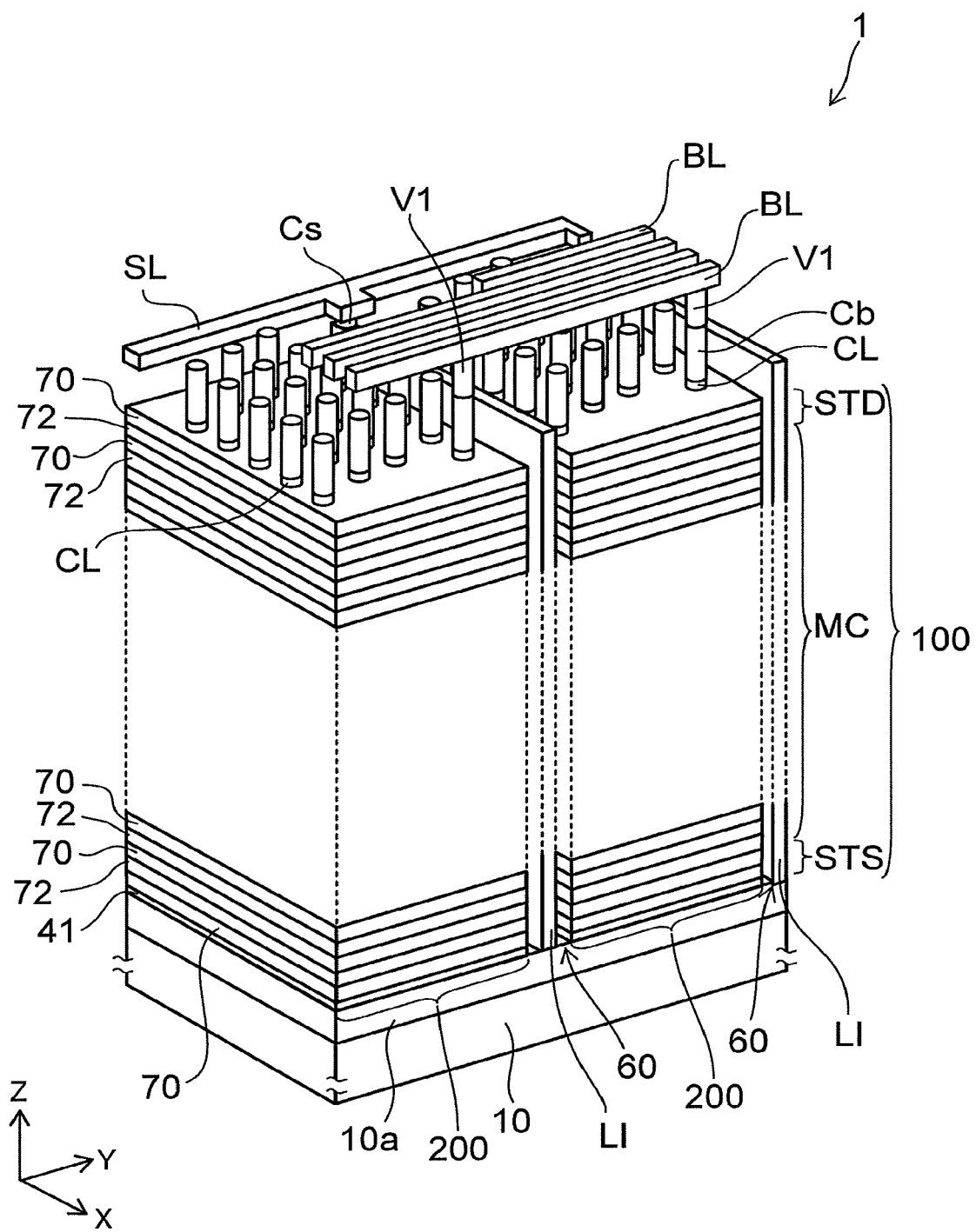
FIG. 2 is a schematic perspective view of a memory cell array of the semiconductor device of the embodiment.

FIG. 2 is a schematic perspective view of the memory cell array 1.

Figure 3:
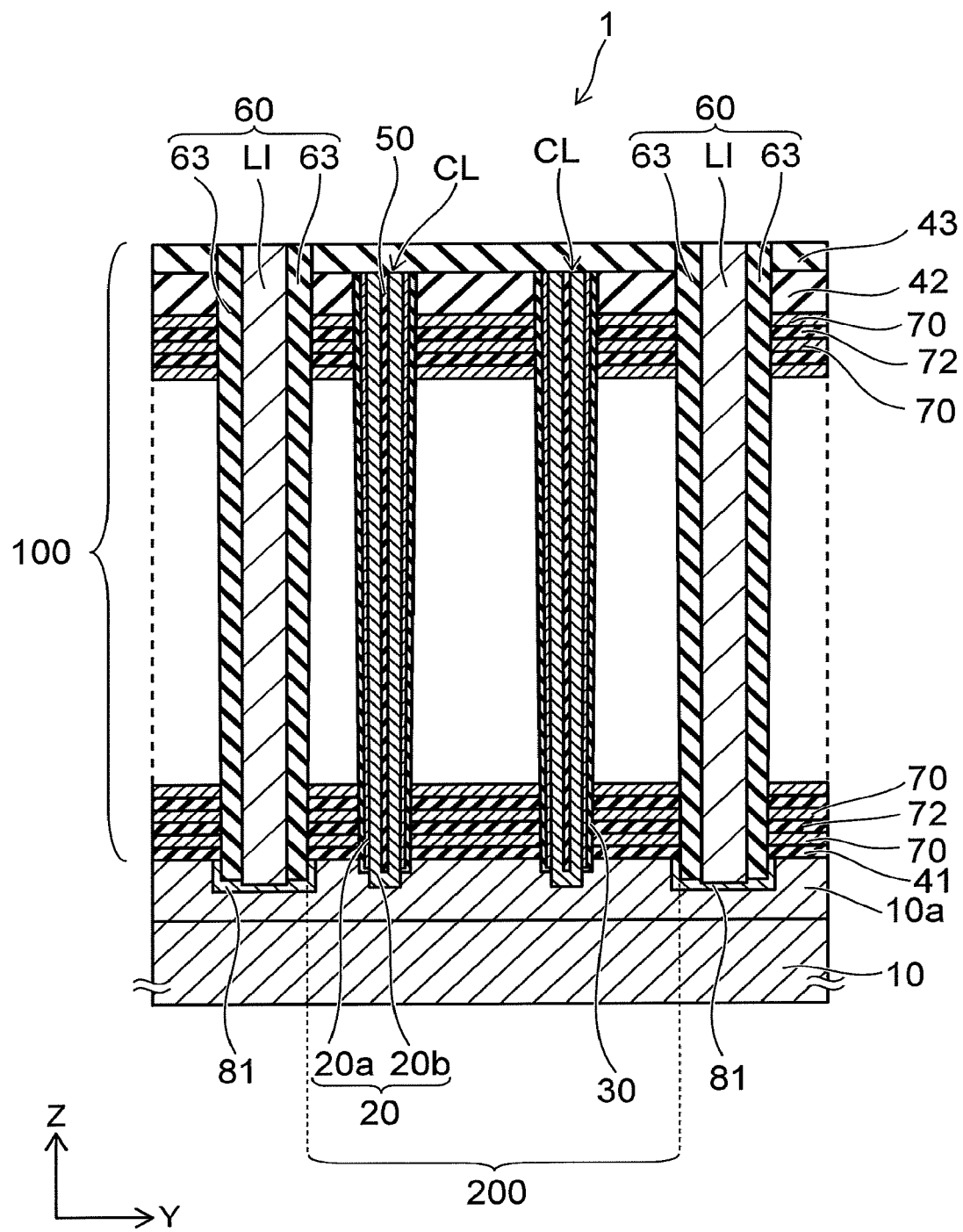
FIG. 3 is a schematic cross-sectional view of the memory cell array of the semiconductor device of the embodiment.

FIG. 3 is a schematic cross-sectional view of the memory cell array 1.

In FIG. 2, two mutually-orthogonal directions parallel to a major surface of a substrate 10 are taken as an X-direction and a Y-direction; and a direction orthogonal to both the X-direction and the Y-direction is taken as a Z-direction (a stacking direction). The X-direction, the Y-direction, and the Z-direction shown in the other drawings correspond respectively to the X-direction, the Y-direction, and the Z-direction of FIG. 2.

The memory cell array 1 includes the substrate 10, a stacked body 100 provided on the substrate 10, multiple columnar portions CL, multiple separation portions 60, and upper layer interconnects provided above the stacked body 100. In FIG. 2, for example, bit lines BL and a source line SL are shown as the upper layer interconnects.

The multiple columnar portions CL are disposed in the memory region MA shown in FIG. 1. The columnar portions CL are formed in substantially circular columnar configurations extending in the stacking direction (the Z-direction) through the stacked body 100. The multiple columnar portions CL have, for example, a staggered arrangement. Or, the multiple columnar portions CL may have a square lattice arrangement along the X-direction and the Y-direction.

The separation portions 60 extend in the X-direction through the memory region MA and the terrace region TA and divide the stacked body 100 into multiple blocks (or fingers) 200 in the Y-direction.

The multiple bit lines BL are provided above the stacked body 100. The multiple bit lines BL are, for example, metal films extending in the Y-direction. The multiple bit lines BL are separated from each other in the X-direction.

The upper end portion of a semiconductor body 20 of the columnar portion CL described below is connected to the bit line BL via a contact Cb and a contact V1 shown in FIG. 2.

As shown in FIG. 3, the stacked body 100 includes multiple metal layers 70 stacked on the substrate 10. The multiple metal layers 70 are stacked in a direction (the Z-direction) perpendicular to the major surface of the substrate 10 with an insulating layer (an insulator) 72 interposed.

The metal layer 70 is, for example, a tungsten layer including tungsten as a major component, or a molybdenum layer including molybdenum as a major component. The insulating layer 72 is a silicon oxide layer including silicon oxide as a major component.

The substrate 10 is, for example, a silicon substrate; and an active region 10*a* is provided on the front surface side of the substrate 10. The active region 10*a* is, for example, a P-type silicon region (a P-type well).

An insulating layer 41 is provided on the surface of the active region 10*a*. The metal layer 70 of the lowermost layer is provided on the insulating layer 41. An insulating layer 42 is provided on the metal layer 70 of the uppermost layer; and an insulating layer 43 is provided on the insulating layer 42. The insulating layer 43 covers the upper ends of the columnar portions CL.

Figure 5A:
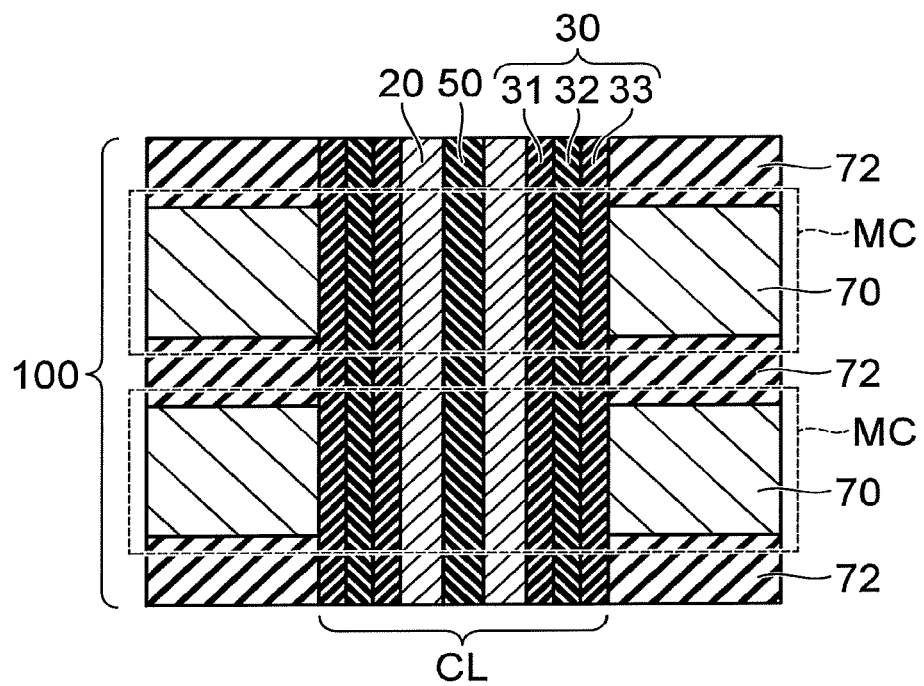
FIGS. 5A and 5B are enlarged cross-sectional views of one portion of the semiconductor device of the embodiment.

FIG. 5A is an enlarged cross-sectional view of one portion of FIG. 3.

The columnar portion CL includes a memory film 30, the semiconductor body 20, and an insulative core film 50.

The semiconductor body 20 extends to be continuous in a pipe-like configuration in the stacking direction (the Z-direction) through the stacked body 100. The memory film 30 is provided between the semiconductor body 20 and the metal layers 70 and surrounds the semiconductor body 20 from the outer perimeter side. The core film 50 is provided on the inner side of the semiconductor body 20 having a pipe-like configuration.

The upper end portion of the semiconductor body 20 is connected to the bit line BL via the contact Cb and the contact V1 shown in FIG. 2. As shown in FIG. 3, the lower end portion of the semiconductor body 20 contacts the active region 10*a*.

As shown in FIG. 5A, the memory film 30 is a stacked film including a tunneling insulating film 31, a charge storage film (a charge storage portion) 32, and a blocking insulating film 33.

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the metal layers 70.

The semiconductor body 20, the memory film 30, and the metal layer 70 are included in a memory cell MC. The memory cell MC has a vertical transistor structure in which the metal layer 70 surrounds the periphery of the semiconductor body 20 with the memory film 30 interposed.

In the memory cell MC that has the vertical transistor structure, the semiconductor body 20 is, for example, a channel body of silicon; and the metal layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulator.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge that is stored in the charge storage film 32 from being discharged into the metal layer 70. Also, the blocking insulating film 33 prevents back-tunneling of the charge from the metal layer 70 into the columnar portion CL.

As shown in FIG. 2, a drain-side selection transistor STD is provided in the upper layer portion of the stacked body 100; and a source-side selection transistor STS is provided in the lower layer portion of the stacked body 100.

The metal layer 70 of at least the uppermost layer may function as a control gate of the drain-side selection transistor STD. The metal layer 70 of at least the lowermost layer may function as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 of the columnar portion CL and are included in one memory string. For example, the memory strings have a staggered arrangement in a planar direction parallel to the XY plane; and the multiple memory cells MC are provided three-dimensionally in the X-direction, the Y-direction, and the Z-direction.

The separation portion 60 will now be described.

As shown in FIG. 2 and FIG. 3, the separation portion 60 includes an interconnect portion LI and an insulating film 63. The insulating film 63 is not illustrated in FIG. 2.

The interconnect portion LI spreads in the X-direction and the Z-direction and is, for example, a film including a metal. The insulating film 63 is provided on the side surface of the interconnect portion LI. As shown in FIG. 3, the insulating film is provided between the stacked body 100 and the interconnect portion LI.

Multiple semiconductor regions 81 are formed in the surface of the active region 10*a*. The lower end portions of the interconnect portions LI contact the semiconductor regions 81. The multiple semiconductor regions 81 are provided to correspond to the multiple interconnect portions LI. The semiconductor regions 81 are, for example, N-type semiconductor regions. The upper ends of the interconnect portions LI are connected to the source line SL via contacts Cs shown in FIG. 2.

By controlling the potential applied to the metal layer 70 of the lowermost layer, a channel (an inversion layer) can be induced in the surface of the active region 10*a* between the semiconductor region 81 and the lower end portion of the semiconductor body 20; and a current can be caused to flow between the semiconductor region 81 and the lower end portion of the semiconductor body 20. The metal layer 70 of the lowermost layer functions as a control gate for inducing the channel in the surface of the active region 10*a*; and the insulating layer 41 functions as a gate insulating film. In a read operation, electrons are supplied from the interconnect portion LI to the semiconductor body 20 via the semiconductor region 81 and the channel.

The terrace region TA will now be described.

Figure 4:
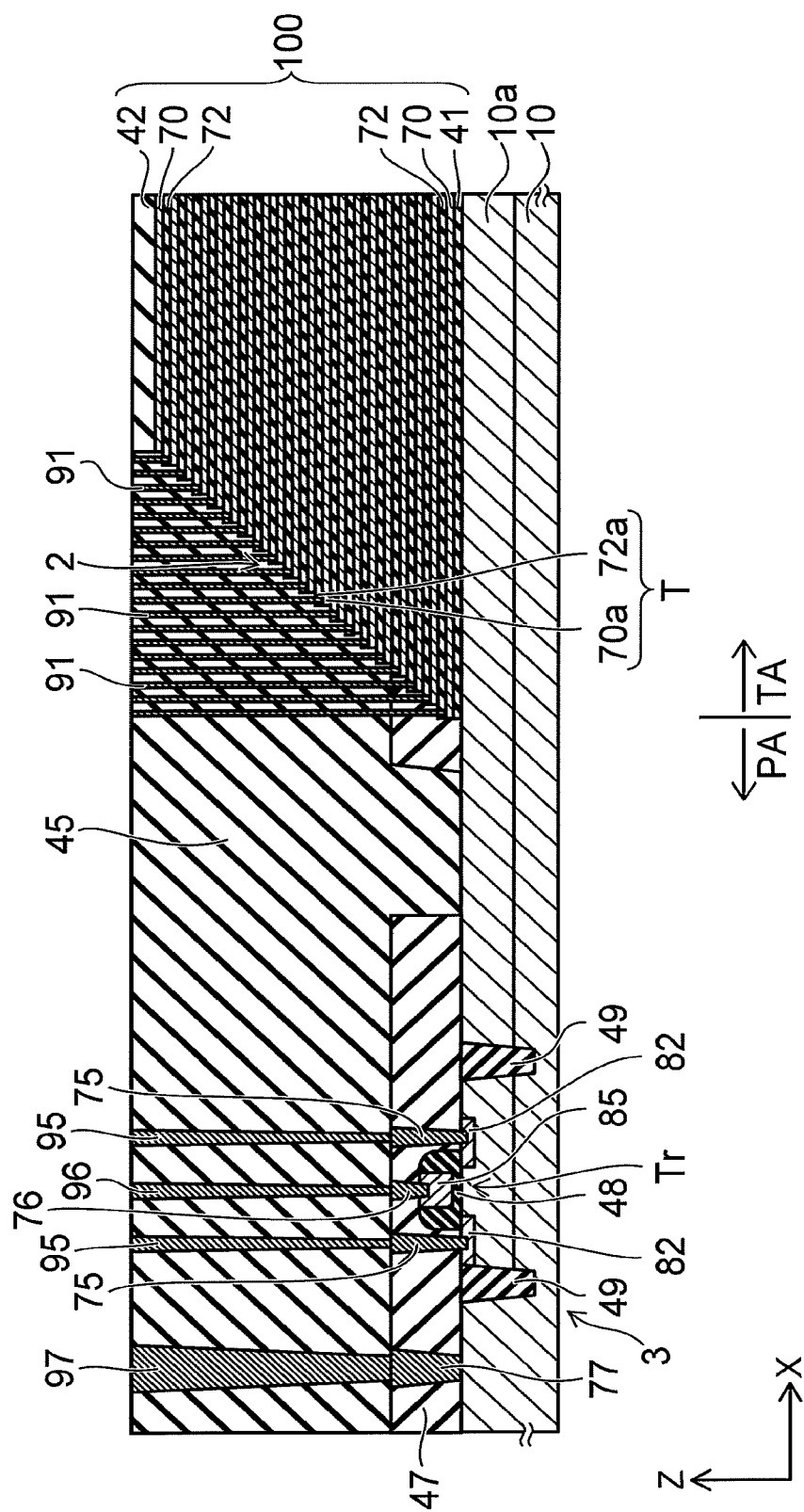
FIG. 4 is a schematic cross-sectional view of a terrace region and a peripheral region of the semiconductor device of the embodiment.

FIG. 4 is a schematic cross-sectional view of the terrace region TA and the peripheral region PA of the substrate 10.

The stacked body 100 extends from the memory region MA described above to the terrace region TA. In the terrace region TA, a portion of the stacked body 100 is patterned into a staircase configuration; and the multiple metal layers 70 include multiple terrace portions 70a arranged in a staircase configuration by forming level differences along the X-direction. The multiple insulating layers 72 also are patterned into a staircase configuration; and the multiple insulating layers 72 include multiple terrace portions 72a arranged in a staircase configuration by forming level differences along the X-direction.

The terrace portions 70a of the metal layers 70 and the terrace portions 72a of the insulating layers 72 collectively are referred to as terrace portions T. One terrace portion T includes one terrace portion 70a and one terrace portion 72a stacked on the one terrace portion 70a.

The staircase portion 2 is formed of the multiple terrace portions T. Each of the terrace portions T is not overlapped by the metal layers 70 of the other layers.

An insulating layer 45 is provided on the staircase portion 2. The insulating layer 45 fills the level differences between the multiple terrace portions T.

Contacts 91 are provided above the terrace portions T. At least one contact 91 is disposed for one terrace portion T. The multiple contacts 91 are provided on the staircase portion 2 to correspond to the multiple terrace portions T.

The contact 91 is a metal material having a substantially circular columnar configuration and includes, for example, tungsten or molybdenum as a major component.

The contacts 91 extend in the stacking direction of the stacked body 100 through the insulating layer 45 and contact the terrace portions 70a of the metal layers 70. The contacts 91 are connected to not-illustrated upper layer interconnects. The upper layer interconnects are electrically connected to a circuit 3 described below. The potentials of the metal layers (the control gates) 70 of the memory cell array 1 are controlled via the contacts 91 and the terrace portions 70a.

The peripheral region PA will now be described.

The active region 10a is formed also in the peripheral region PA. The active region 10a of the peripheral region PA and the active region 10a of the terrace region TA and the memory region MA are separated by an element separation portion 49. For example, the element separation portion 49 has a STI (shallow trench isolation) structure in which an insulating film is filled into a trench.

The circuit 3 that includes a transistor Tr is provided in the peripheral region PA. Although only one transistor Tr is illustrated in FIG. 4, the circuit 3 includes multiple transistors Tr. The multiple transistors Tr are separated from each other by the element separation portion 49. The circuit 3 includes, for example, a CMOS circuit.

The transistor Tr includes a gate electrode 85, a gate insulating film 48, and the semiconductor regions (the active regions) 82 used to form a source region or a drain region. The semiconductor regions 82 are formed in the surface of the active region 10a. The gate electrode 85 is provided, with the gate insulating film 48 interposed, on the region (the channel region) of the active region 10a between the semiconductor regions 82.

An insulating layer 47 is provided on the substrate 10 of the peripheral region PA to cover the transistor Tr. The insulating layer 45 is provided on the insulating layer 47. The insulating layer 45 is provided on the insulating layer 47 of the peripheral region PA and on the staircase portion 2 of the terrace region TA. The insulating layer 45 is provided also on the substrate 10 between the peripheral region PA and the terrace region TA (the stacked body 100).

Multiple contacts 75 and 76 are provided inside the insulating layer 47. The contacts 75 and 76 include a metal and include, for example, tungsten as a major component.

The contacts 75 extend in the stacking direction (the Z-direction) through the insulating layer 47 and are connected to the semiconductor regions 82 of the transistor Tr. The bottom surfaces (the lower end surfaces) of the contacts 75 are positioned deeper than the surfaces of the semiconductor regions 82.

The contact 76 extends in the stacking direction (the Z-direction) through the insulating layer 47 and is connected to the gate electrode 85 of the transistor Tr.

Contacts 95 are provided inside the insulating layer 45 above the contacts 75; and a contact 96 is provided inside the insulating layer 45 above the contact 76. The contacts 95 and 96 include a metal and include, for example, tungsten as a major component.

The contacts 95 extend in the stacking direction (the Z-direction) through the insulating layer 45 and are connected to the contacts 75. The contact 96 extends in the stacking direction (the Z-direction) through the insulating layer 45 and is connected to the contact 76.

The length in the stacking direction (the Z-direction) of the contact 75 is shorter than the length in the stacking direction (the Z-direction) of the contact 95. The length in the stacking direction (the Z-direction) of the contact 76 is shorter than the length in the stacking direction (the Z-direction) of the contact 96.

The length in the stacking direction (the Z-direction) of the contact 75 is greater than the thickness of one layer of the metal layers 70. The length in the stacking direction (the Z-direction) of the contact 76 is greater than the thickness of one layer of the metal layers 70.

The transistor Tr is connected to not-illustrated upper layer interconnects provided on the insulating layer 45 via the contacts 75, 76, 95, and 96.

In the peripheral region PA, the edge seal portions 77 and 97 are provided in a region outside the region where the transistor Tr is formed. The edge seal portions 77 and 97 include a metal and include, for example, tungsten as a major component.

The edge seal portion 77 extends in the stacking direction (the Z-direction) through the insulating layer 47 and reaches the substrate 10. The edge seal portion 97 extends in the stacking direction (the Z-direction) on the edge seal portion 77 and is connected to the edge seal portion 77.

The length in the stacking direction (the Z-direction) of the edge seal portion 77 is shorter than the length in the stacking direction (the Z-direction) of the edge seal portion 97. The length in the stacking direction (the Z-direction) of the edge seal portion 77 is greater than the thickness of one layer of the metal layers 70.

As shown in FIG. 1, the edge seal portions 97 and 77 continuously surround the memory region MA, the terrace region TA, and the region where the transistor Tr is formed.

Figure 5B:
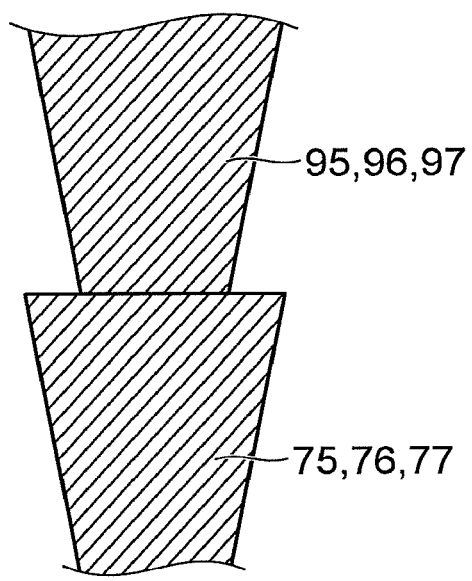

FIG. 5B is a schematic enlarged cross-sectional view of the connection portion between the contact 95 and the contact 75, the connection portion between the contact 96 and the contact 76, and the connection portion between the edge seal portion 97 and the edge seal portion 77.

The diameter of the upper end of the contact 75 is larger than the diameter of the lower end of the contact 95; and a level difference is formed between the side surface of the contact 75 and the side surface of the contact 95 at the connection portion between the contact 75 and the contact 95.

Similarly, the diameter of the upper end of the contact 76 is larger than the diameter of the lower end of the contact 96; and a level difference is formed between the side surface of the contact 76 and the side surface of the contact 96 at the connection portion between the contact 76 and the contact 96.

The width of the upper end of the edge seal portion 77 is wider than the width of the lower end of the edge seal portion 97; and a level difference is formed between the side surface of the edge seal portion 77 and the side surface of the edge seal portion 97 at the connection portion between the edge seal portion 77 and the edge seal portion 97.

A method for manufacturing the semiconductor device of the embodiment will now be described.

First, the processes for the memory region MA will be described with reference to FIG. 6 to FIG. 16. FIG. 6 to FIG. 16 are cross-sectional views corresponding to FIG. 3.

Figure 6:
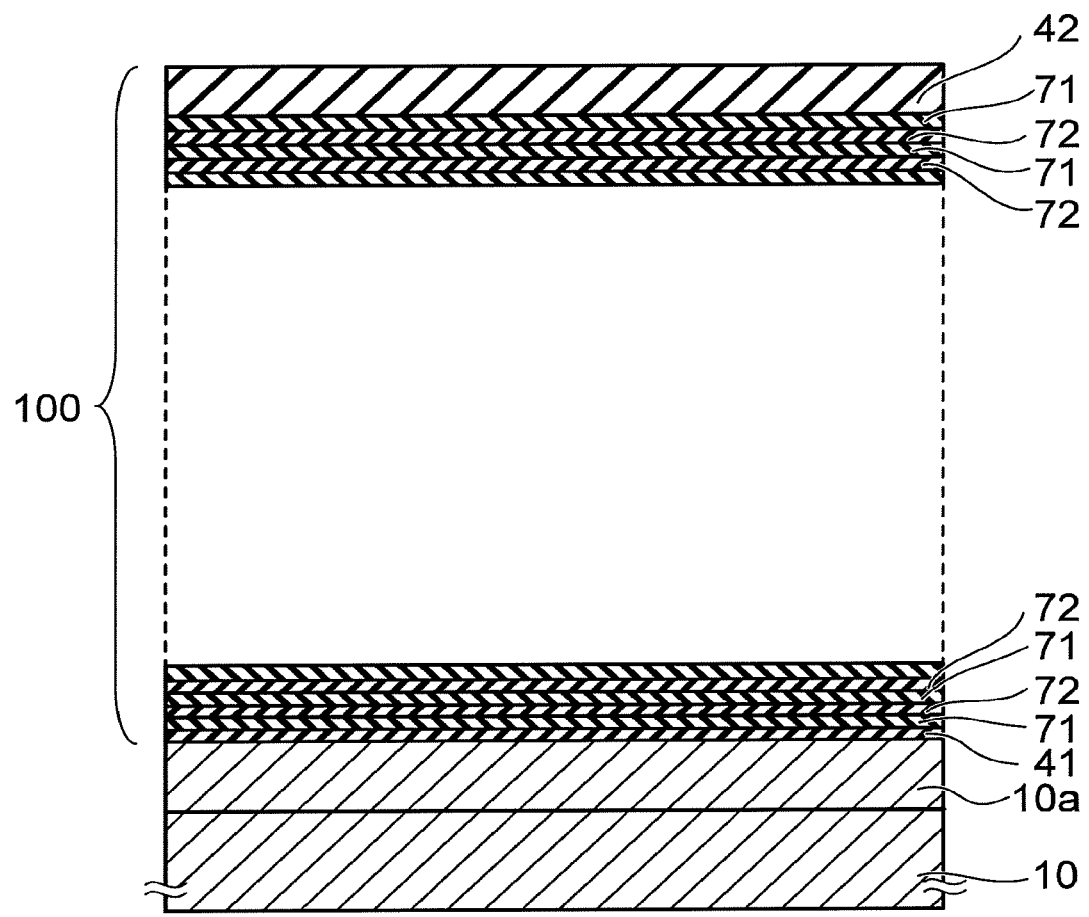
FIG. 6 to FIG. 27 are schematic cross-sectional views showing a method for manufacturing the semiconductor device of the embodiment.

As shown in FIG. 6, the stacked body 100 that includes multiple first layers 71 and the multiple second layers 72 is formed on the active region 10a of the substrate 10. The insulating layer 41 is formed on the active region 10a; and the first layer (the sacrificial layer) 71 and the second layer (the insulating layer) 72 are stacked alternately on the insulating layer 41. The process of alternately stacking the first layer 71 and the second layer 72 is multiply repeated. The insulating layer 42 is formed on the first layer 71 of the uppermost layer. The first layer 71 is a silicon nitride layer; and the second layer 72 is a silicon oxide layer.

Figure 7:
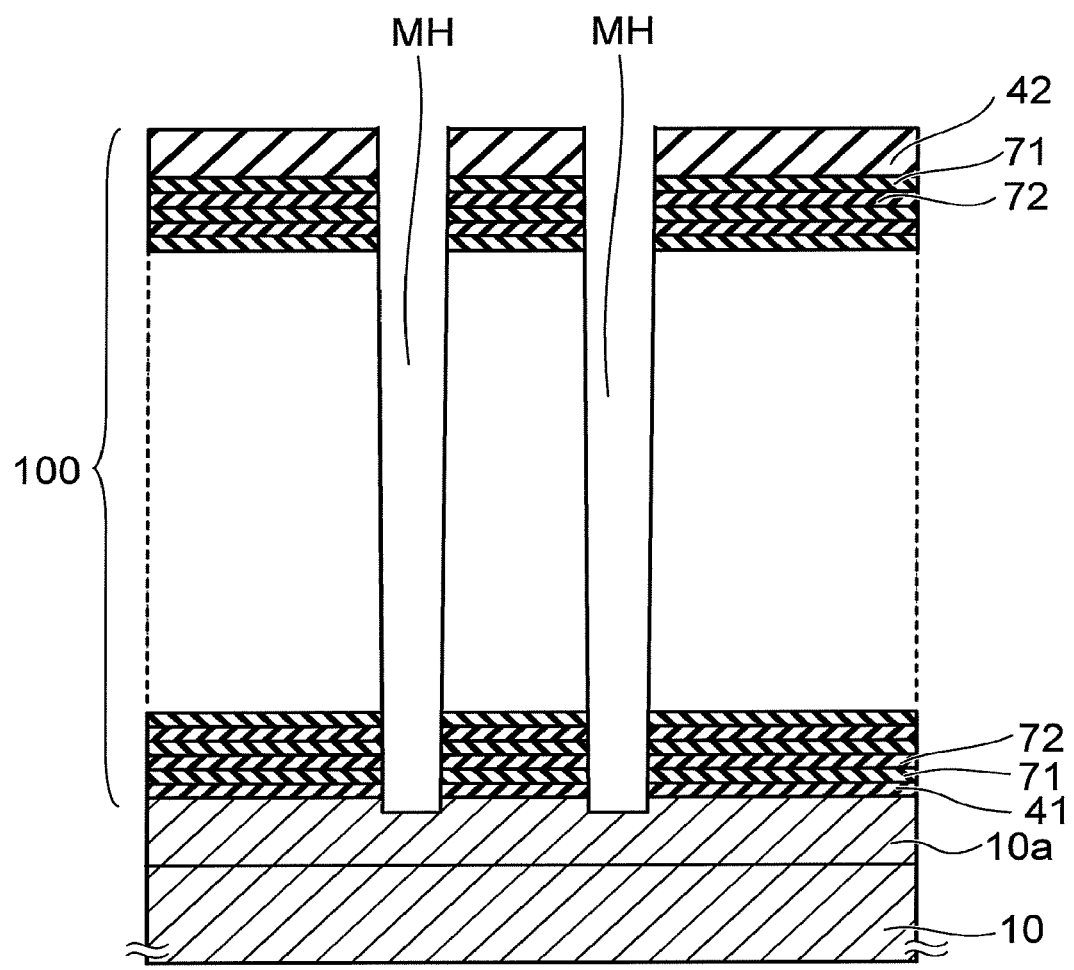

As shown in FIG. 7, multiple memory holes MH are formed in the stacked body 100. The memory holes MH are formed by RIE (reactive ion etching) using a not-illustrated mask layer. The memory holes MH pierce the stacked body 100 and reach the active region 10a.

Figure 8:
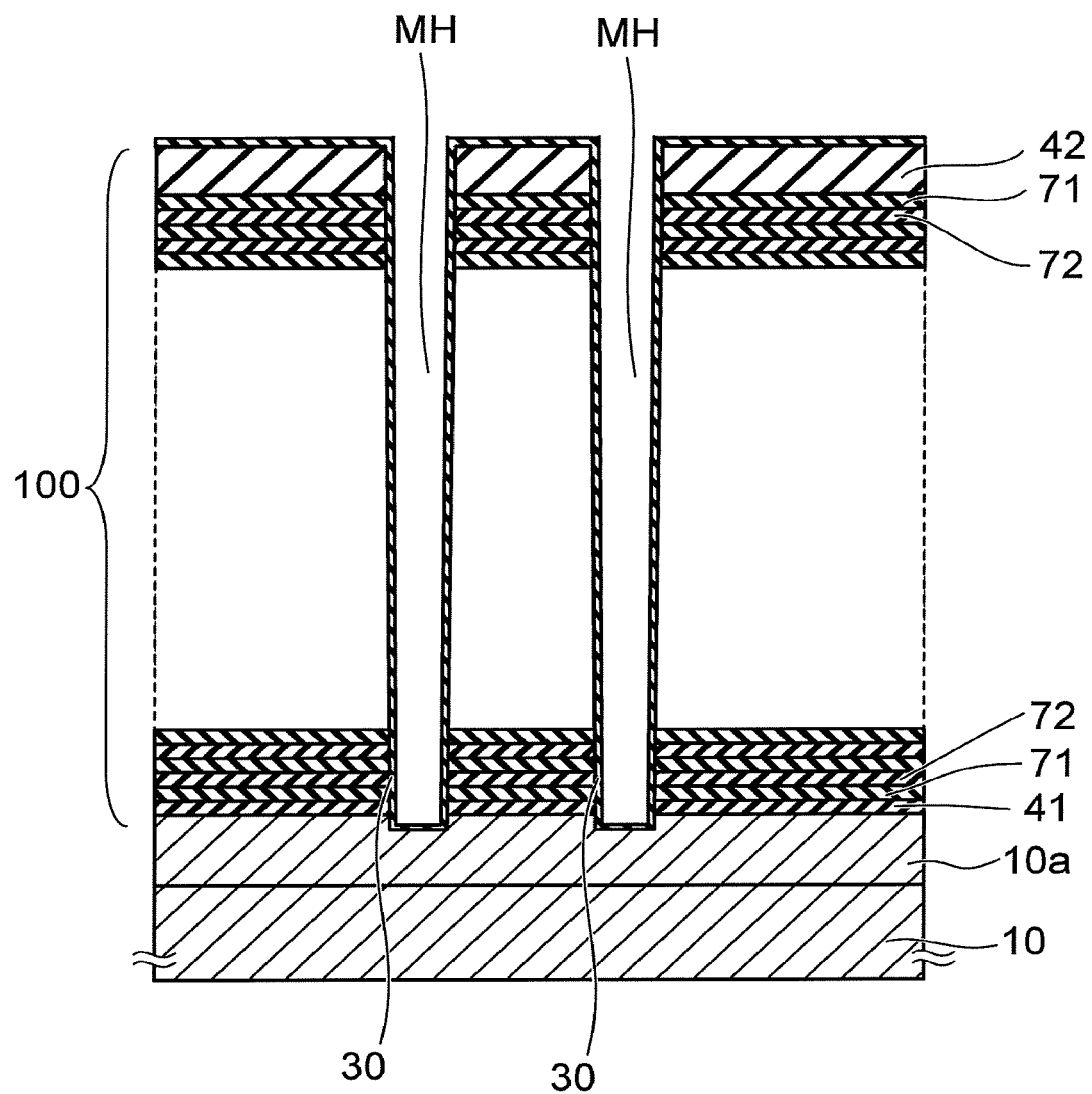

As shown in FIG. 8, the memory film 30 is formed in the memory holes MH. The memory film 30 is formed conformally along the side surfaces and the bottom surfaces of the memory holes MH.

Figure 9:
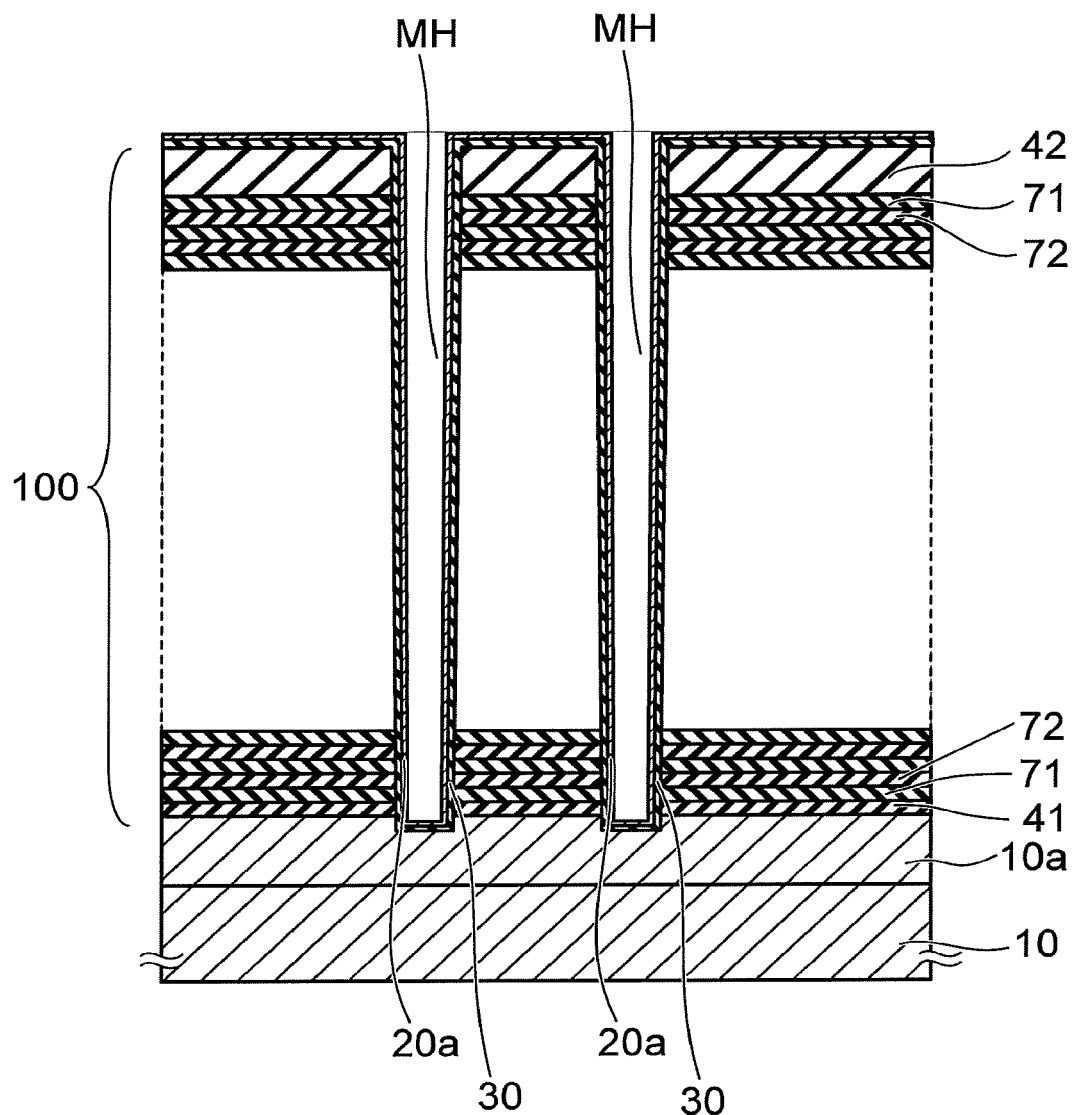

As shown in FIG. 9, a cover film 20a is formed conformally on the inner side of the memory film 30.

Figure 10:
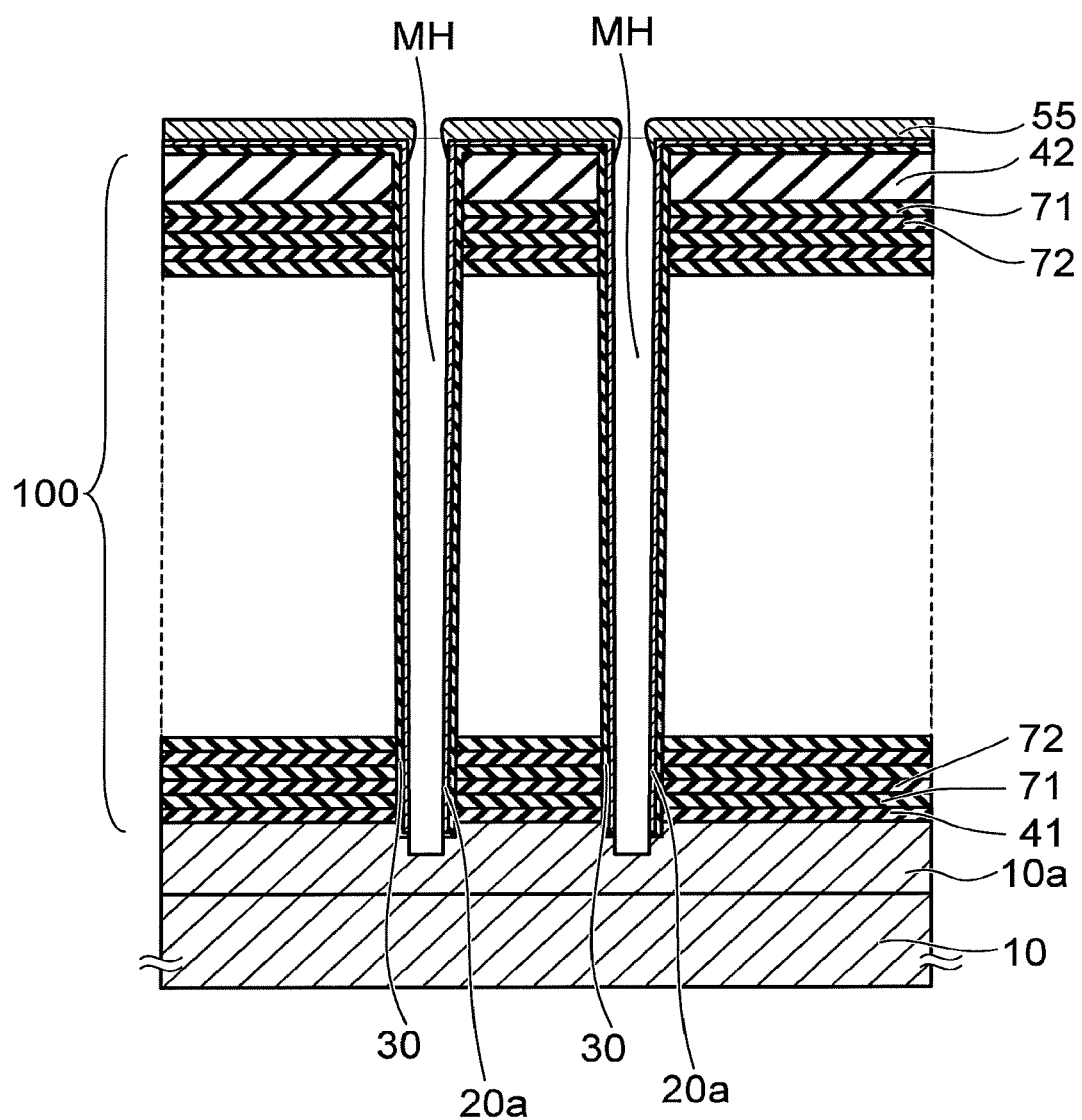

Then, as shown in FIG. 10, a mask layer 55 is formed on the insulating layer 42; and the cover film 20a and the memory film 30 that are deposited on the bottom surfaces of the memory holes MH are removed by RIE. In the RIE, the memory film 30 that is formed on the side surfaces of the memory holes MH is protected by being covered with the cover film 20a and is not damaged by the RIE.

Figure 11:
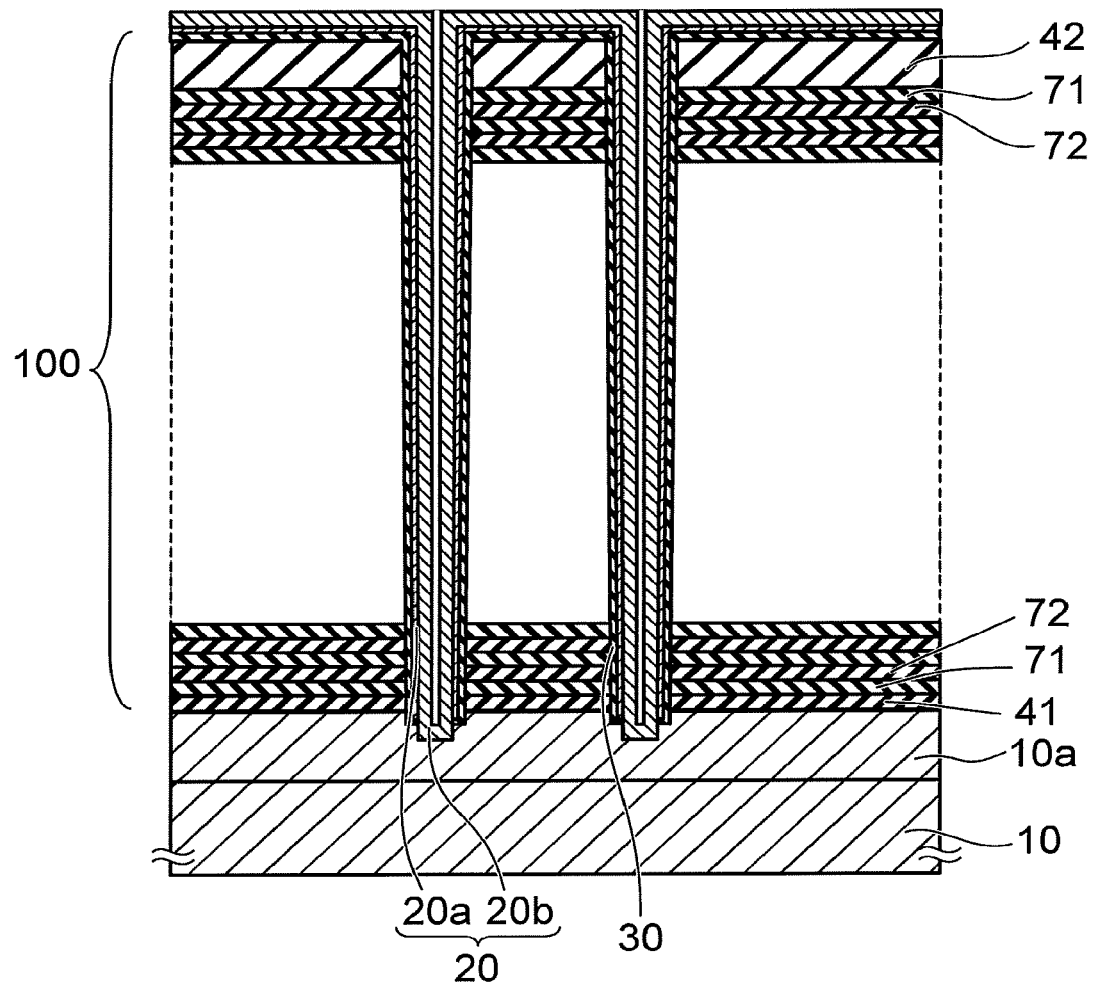

After removing the mask layer 55, a semiconductor body 20b is formed inside the memory holes MH as shown in FIG. 11. The semiconductor body 20b is formed on the side surface of the cover film 20a and the active region 10a at the bottom surfaces of the memory holes MH. The lower end portion of the semiconductor body 20b contacts the active region 10a.

For example, the cover film 20a and the semiconductor body 20b are crystallized into polycrystalline silicon films by heat treatment after being formed as amorphous silicon films.

Figure 12:
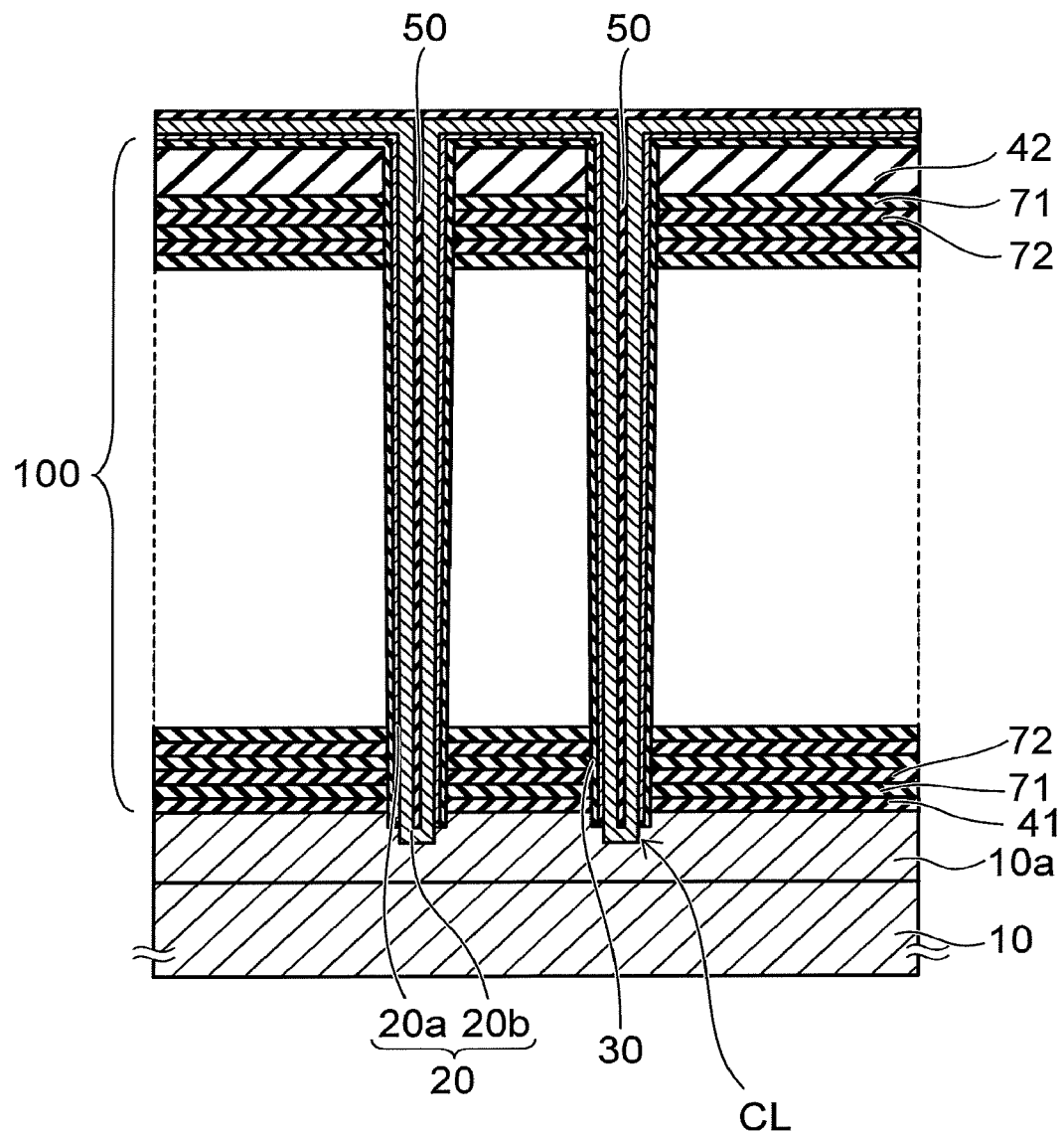

As shown in FIG. 12, the core film 50 is formed on the inner side of the semiconductor body 20b. The multiple columnar portions CL that include the memory film 30, the semiconductor body 20, and the core film 50 are formed inside the stacked body 100 of the memory region MA.

The films that are deposited on the insulating layer 42 shown in FIG. 12 are removed by CMP (chemical mechanical polishing) or etch-back.

Figure 13:
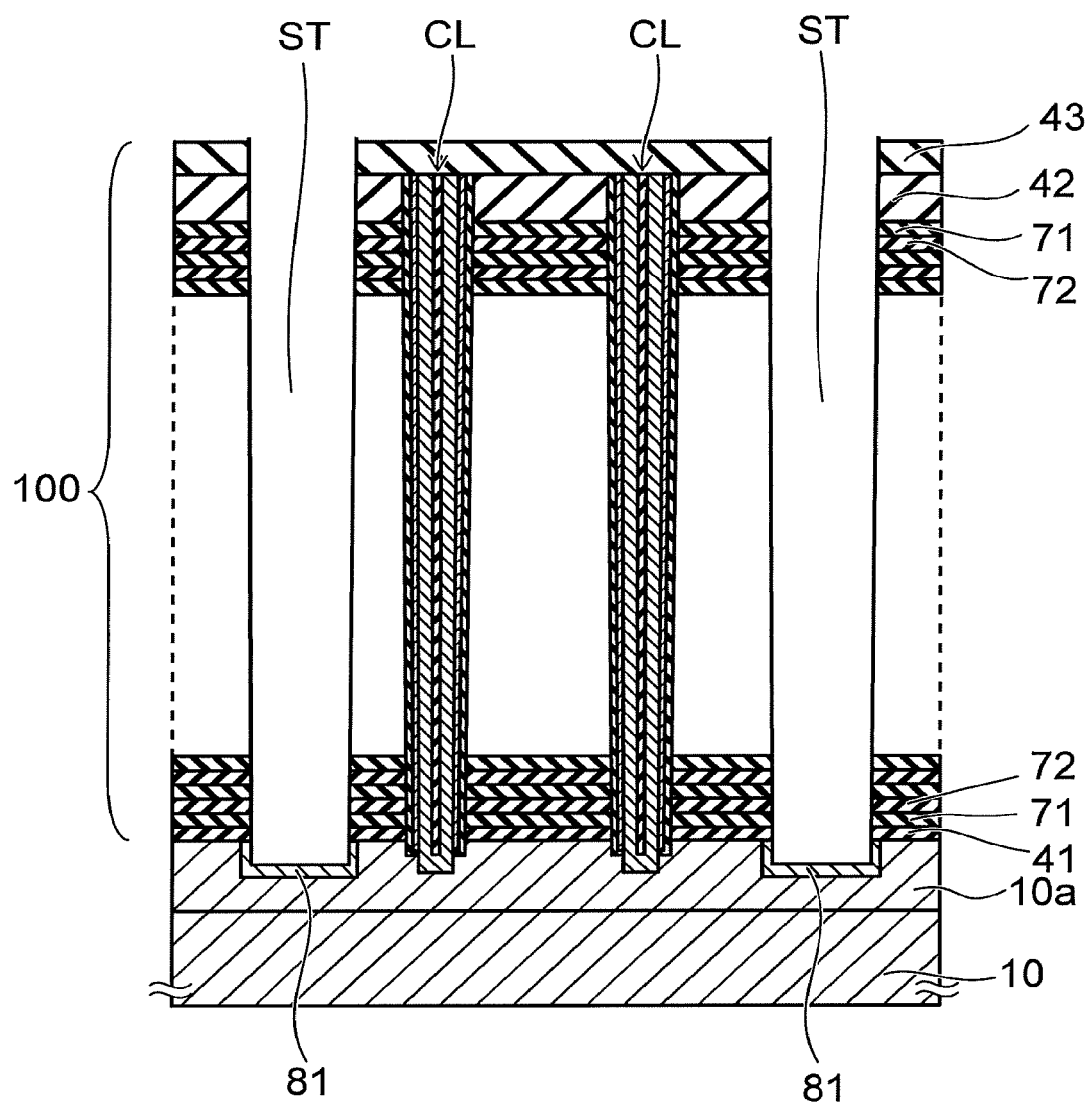

Subsequently, as shown in FIG. 13, the insulating layer 43 is formed on the insulating layer 42. The insulating layer 43 covers the upper ends of the columnar portions CL.

Then, multiple slits ST are formed in the stacked body 100 by RIE using a not-illustrated mask layer. The slits ST pierce the stacked body 100 and reach the active region 10a.

An impurity is implanted into the active region 10a exposed at the bottom surfaces of the slits ST by ion implantation; and the semiconductor regions 81 are formed in the surface of the active region 10a at the bottom surfaces of the slits ST.

Then, the first layers 71 are removed by an etchant or an etching gas supplied via the slits ST. For example, the first layers 71 which are silicon nitride layers are removed using an etchant including phosphoric acid.

Figure 14:
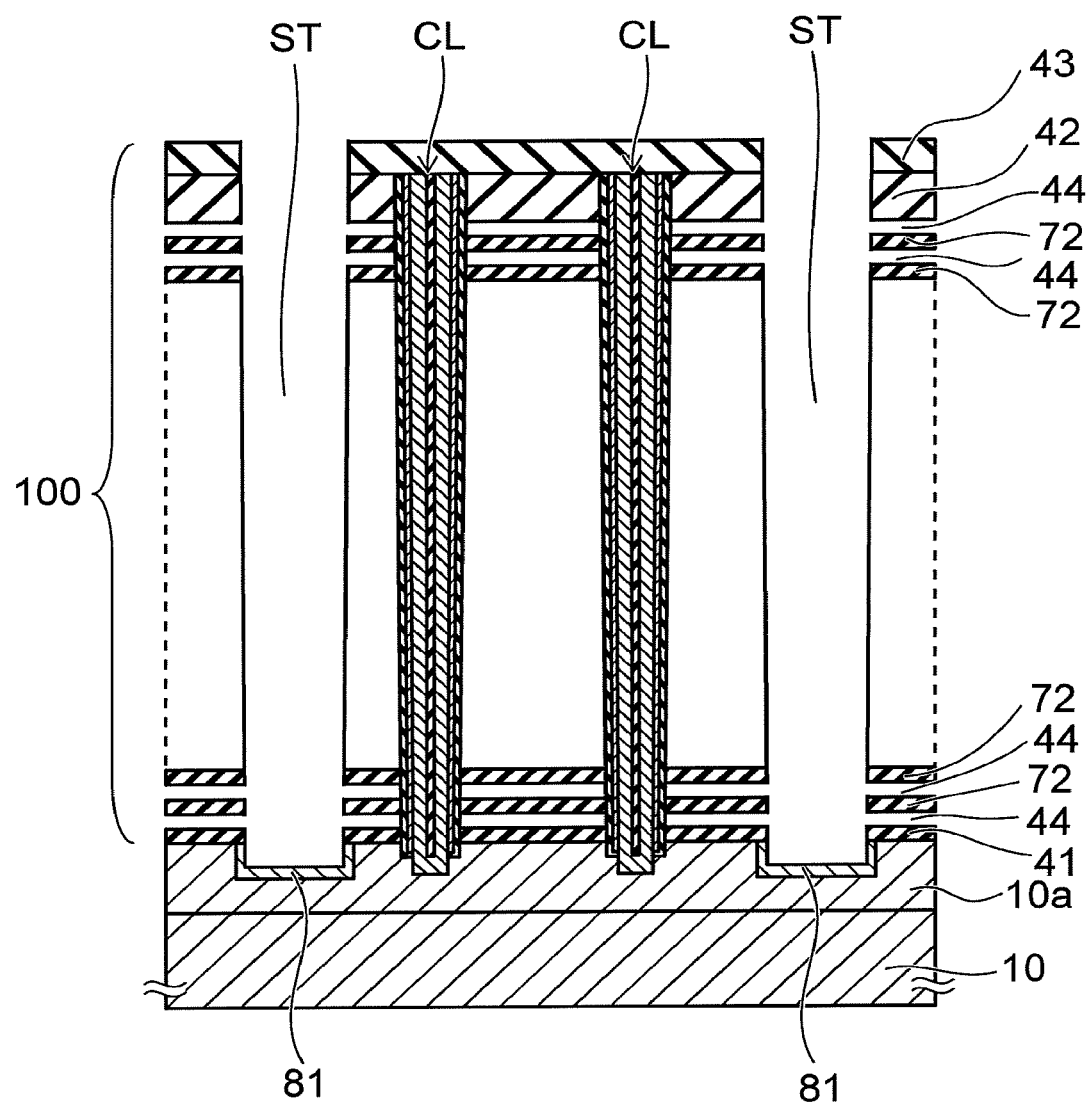

The first layers 71 are removed; and a gap 44 is formed between the second layers 72 adjacent to each other above and below as shown in FIG. 14. The gap 44 is formed also between the insulating layer 41 and the second layer 72 of the lowermost layer and between the insulating layer 42 and the second layer 72 of the uppermost layer.

The multiple second layers 72 of the memory region MA contact the side surfaces of the multiple columnar portions CL to surround the side surfaces of the columnar portions CL. The multiple second layers 72 are supported by such a physical bond with the multiple columnar portions CL; and the gap 44 between the second layers 72 is maintained.

Figure 15:
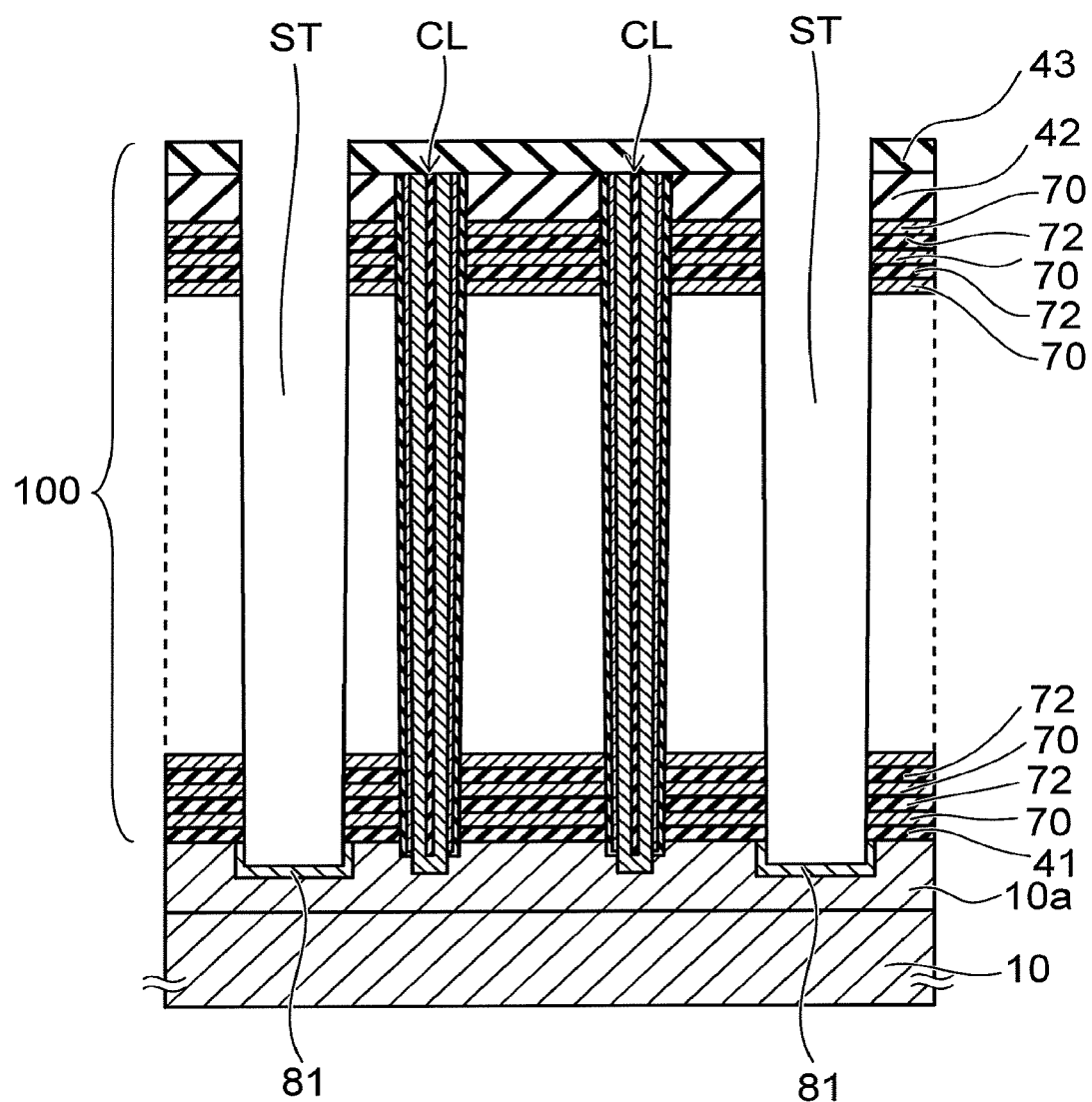

The metal layer 70 shown in FIG. 15 is formed in the gap 44. For example, the metal layer 70 is formed by CVD. A source gas is supplied to the gap 44 via the slits ST. The material film of the metal layer 70 formed on the side surfaces of the slits ST is removed.

Figure 16:
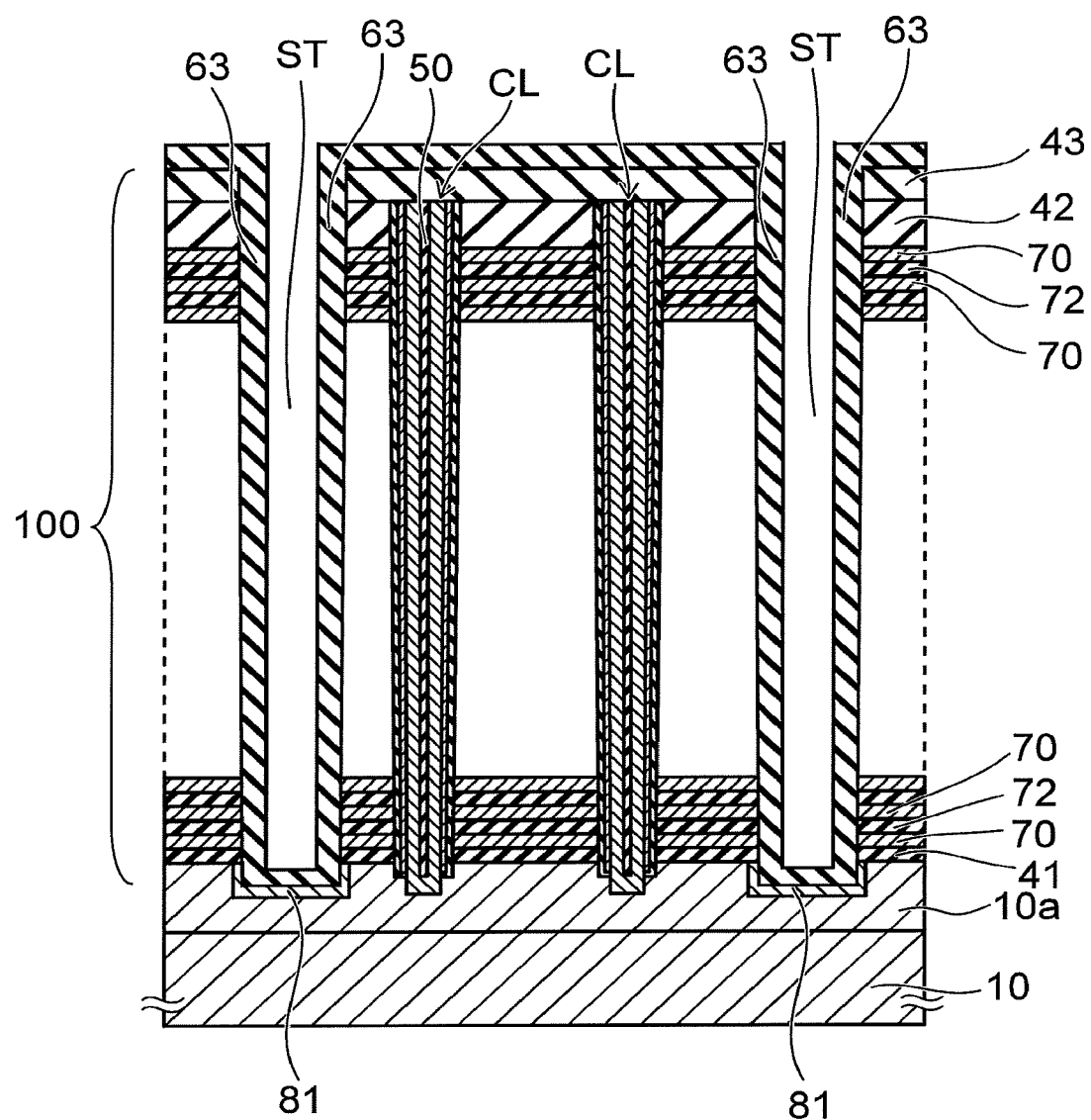
Figure 17:
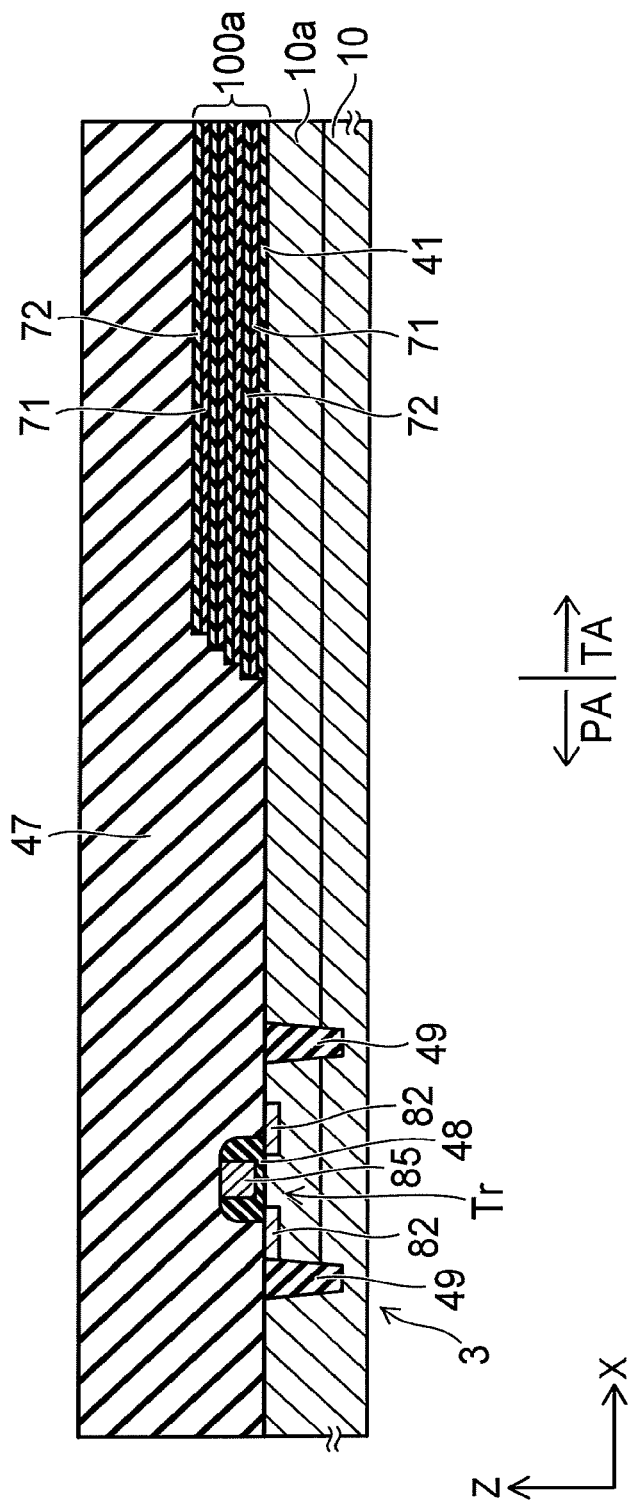

Subsequently, as shown in FIG. 16, the insulating film 63 is formed on the side surfaces and the bottom surfaces of the slits ST. After removing the insulating film 63 formed on the bottom surfaces of the slits ST by RIE, the interconnect portion LI is filled into the inner side of the insulating film 63 inside the slits ST as shown in FIG. 3. The lower end portion of the interconnect portion LI contacts the active region 10a via the semiconductor region 81.

The processes for the terrace region TA and the peripheral region PA will now be described with reference to FIG. 17 to FIG. 27. FIG. 17 to FIG. 27 are cross-sectional views corresponding to FIG. 4.

The element separation portions 49 that divide the active region 10a are formed in the surface of the substrate 10 in the peripheral region PA. The transistor Tr that includes the semiconductor regions 82, the gate insulating film 48, and the gate electrode 85 is formed in the region subdivided by the multiple element separation portions 49. The circuit 3 that includes the multiple transistors Tr is formed in the peripheral region PA. The insulating layer 47 is formed on the substrate 10 of the peripheral region PA to cover the circuit 3.

On the other hand, a stacked portion 100a is formed as a portion of the stacked body 100 on the substrate 10 of the terrace region TA and the memory region MA. The stacked portion 100a includes the multiple first layers 71 and the multiple second layers 72.

After forming the stacked portion 100a, a staircase portion is formed in a portion of the stacked portion 100a provided in the terrace region TA. The staircase portion is covered with the insulating layer 47.

Figure 18:
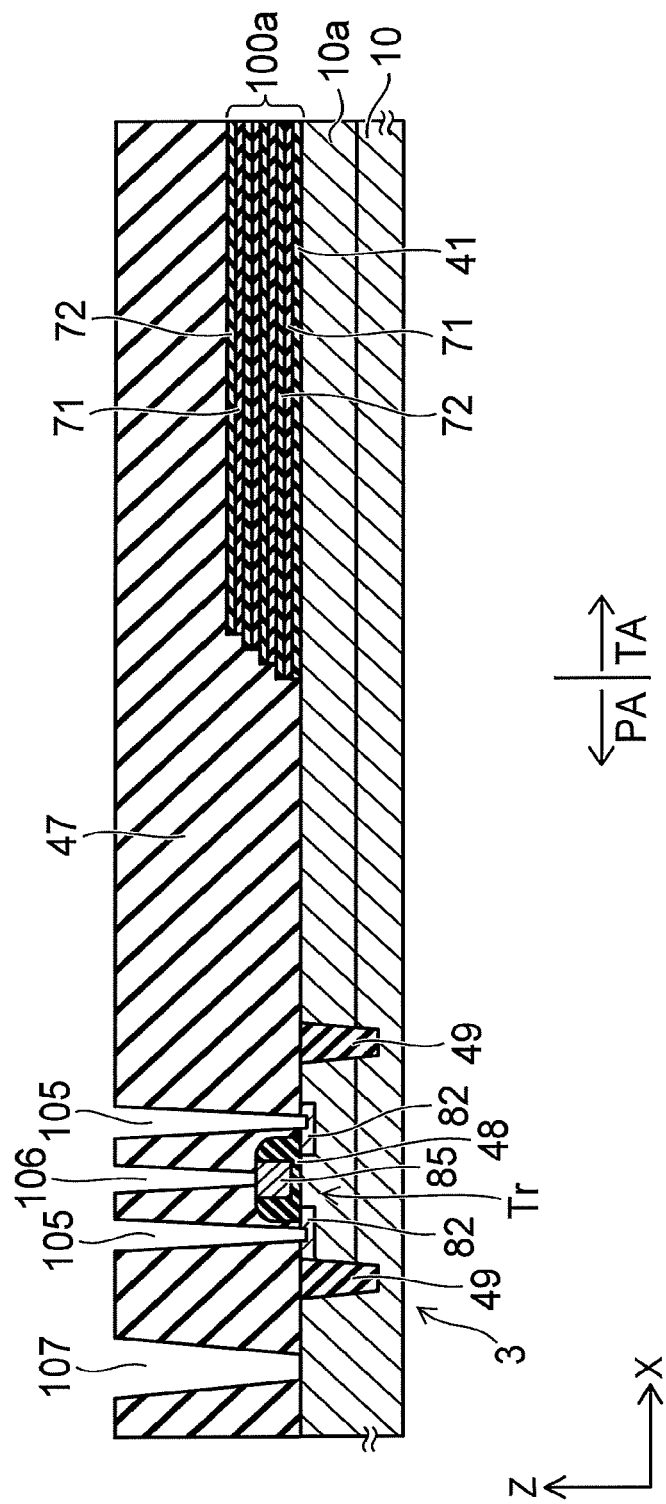

As shown in FIG. 18, multiple contact holes 105 and 106 are formed in the insulating layer 47. A trench 107 is formed in the insulating layer 47 at the periphery of the region where the transistor Tr is formed.

The contact holes 105 and 106 and the trench 107 are formed simultaneously by RIE using a not-illustrated mask layer.

The contact holes 105 pierce the insulating layer 47 and reach the semiconductor regions 82. The bottom surfaces of the contact holes 105 are positioned deeper than the surfaces of the semiconductor regions 82. However, the contact holes 105 do not extend through the semiconductor regions 82 and do not reach the active region 10a.

The contact hole 106 pierces the insulating layer 47 and reaches the gate electrode 85.

The trench 107 pierces the insulating layer 47 and reaches at least the surface of the substrate 10. The trench 107 may be formed to be deeper than the surface of the substrate 10. The trench 107 continuously surrounds the memory region MA, the terrace region TA, and the region where the transistor Tr is formed.

Figure 19:
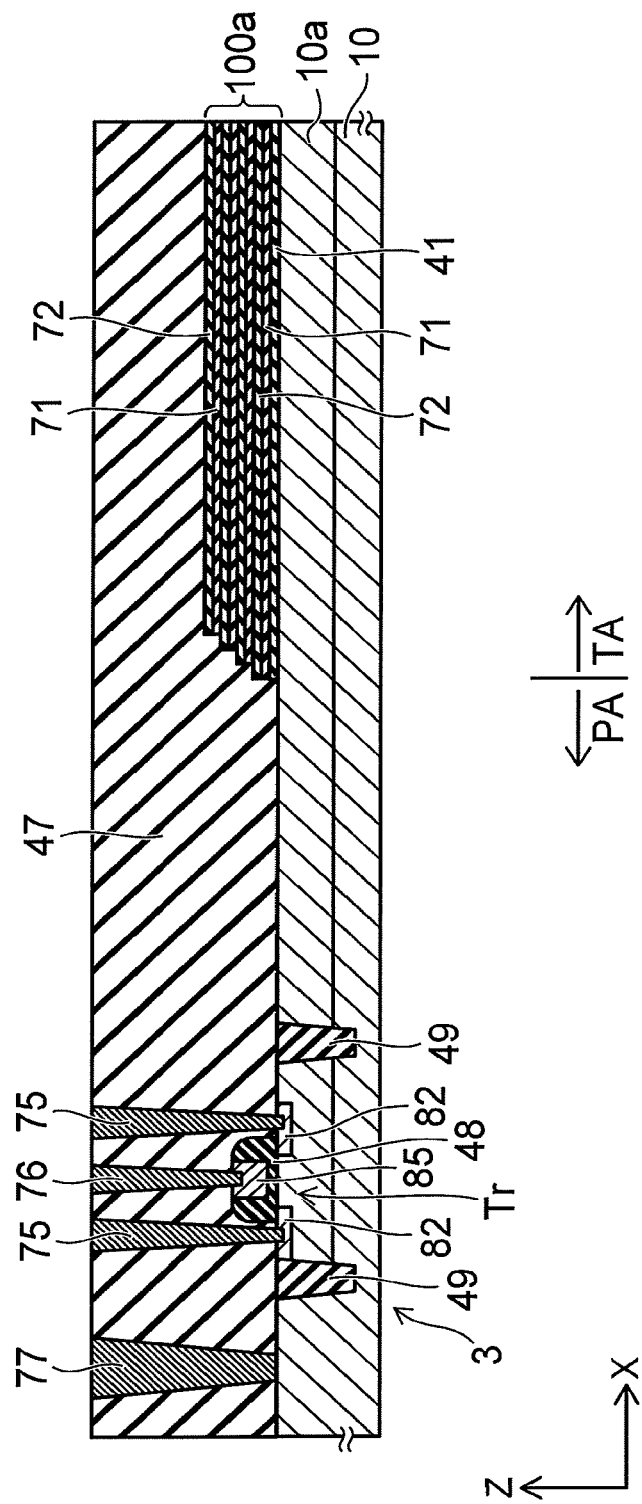

A metal material is formed inside the contact holes 105 and 106 and inside the trench 107. Thereby, as shown in FIG. 19, the contacts 75 and 76 and the edge seal portion 77 are formed inside the insulating layer 47. The contacts 75 and 76 and the edge seal portion 77 include, for example, tungsten as a major component.

The contacts 75 are connected to the semiconductor regions 82 of the transistor Tr; and the contact 76 is connected to the gate electrode 85 of the transistor Tr. The edge seal portion 77 reaches the substrate 10 and pierces the insulating layer 47 to surround the memory region MA, the terrace region TA, and the region where the transistor Tr is formed.

Subsequently, for example, the upper surface of the insulating layer 47, the upper ends of the contacts 75 and 76, and the upper end of the edge seal portion 77 are recessed and planarized by CMP.

Figure 20:
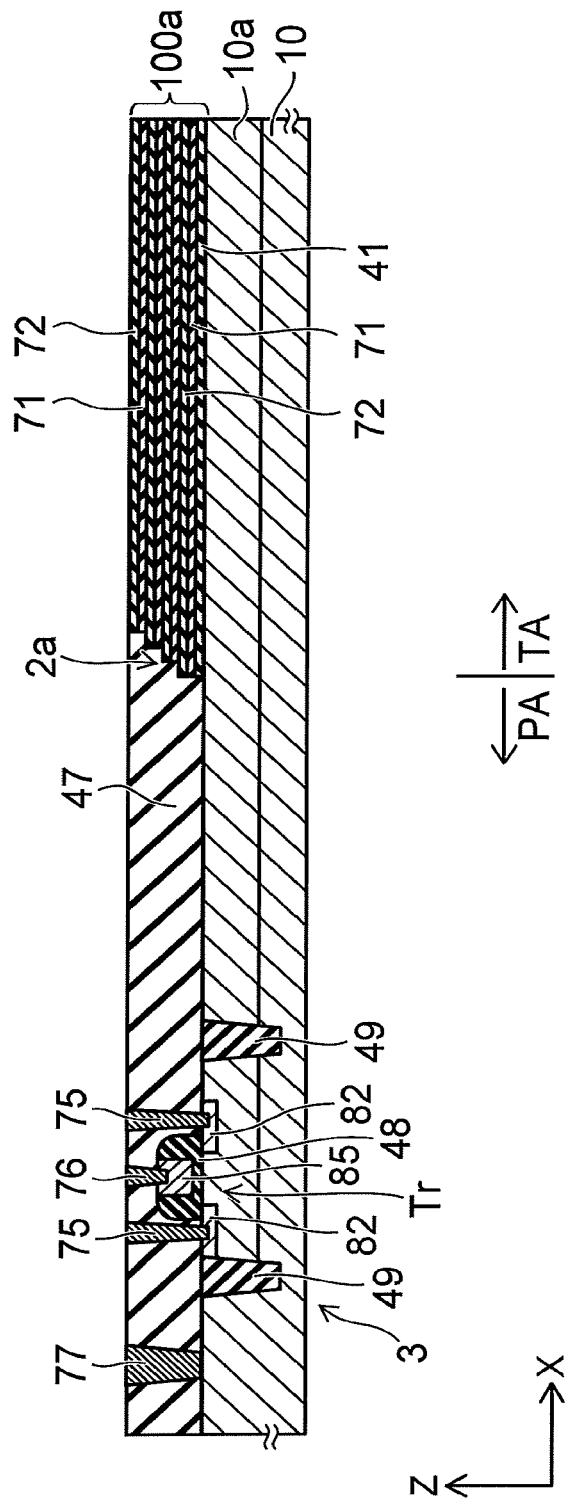

As shown in FIG. 20, the heights of the upper surface of the insulating layer 47, the upper ends of the contacts 75 and 76, and the upper end of the edge seal portion 77 are aligned with the height of the upper surface of the stacked portion 100a. Here, the height refers to the height referenced to the surface of the substrate 10.

Figure 21:
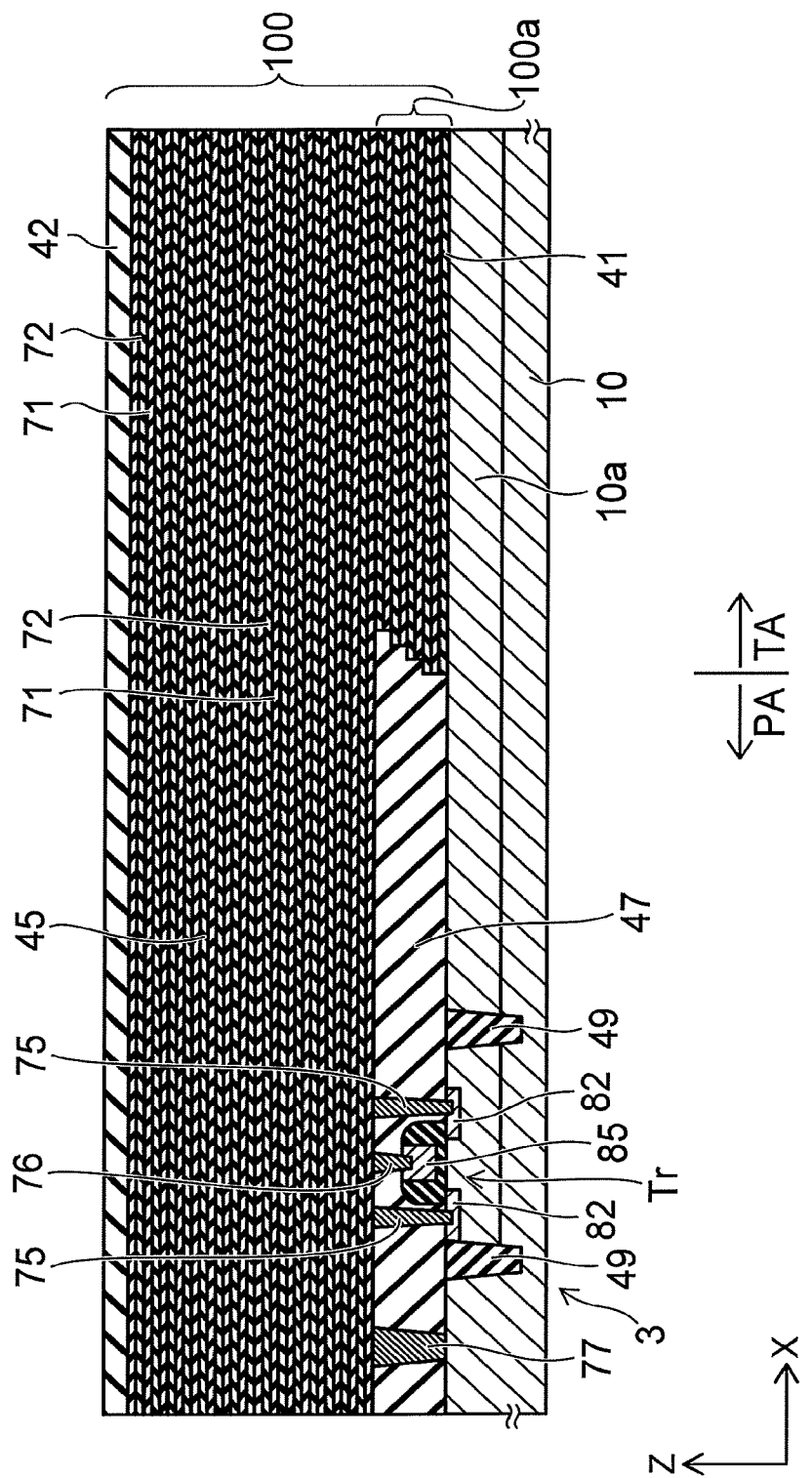

Then, the stacked body 100 that includes the multiple first layers 71 and the multiple second layers 72 is formed continuously in the memory region MA, the terrace region TA, and the peripheral region PA. The stacked body 100 is formed on the stacked portion 100a and on the insulating layer 47 as shown in FIG. 21.

Figure 22:
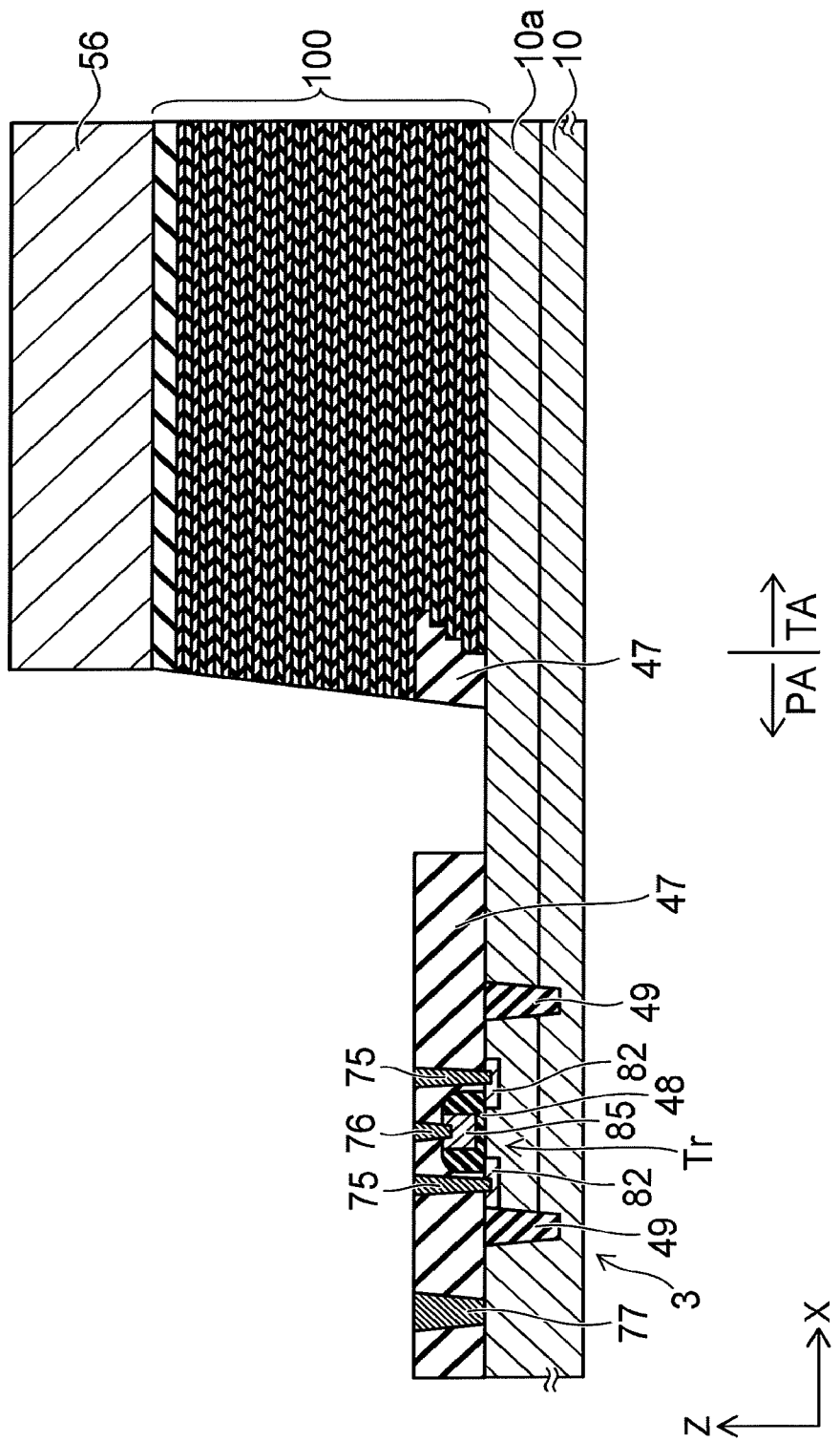
Figure 23:
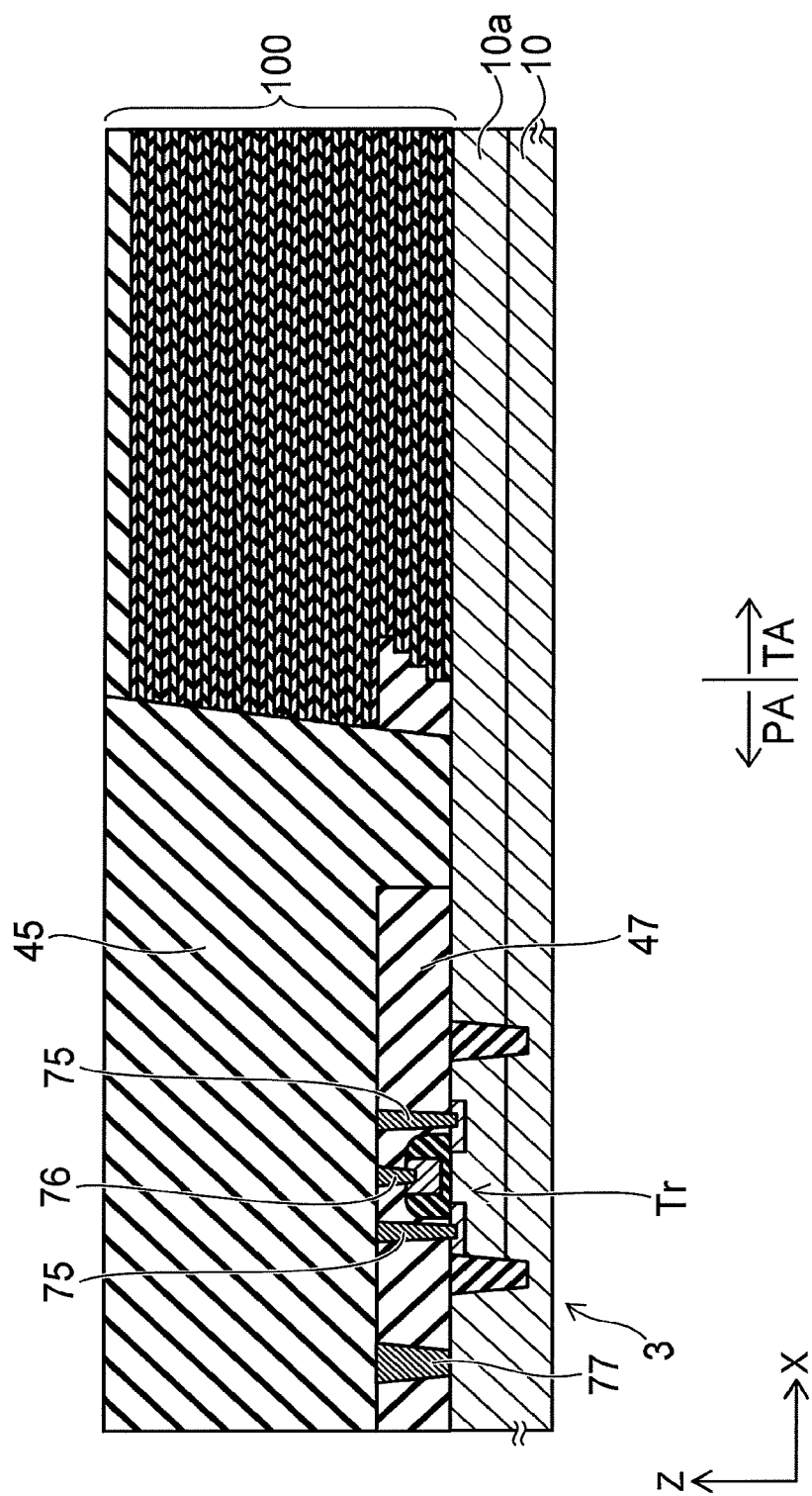

For example, the stacked body 100 that is on the peripheral region PA is removed by RIE using a mask layer 56 shown in FIG. 22. As shown in FIG. 23, the insulating layer 45 is filled into the portion where the stacked body 100 is removed.

Figure 24:
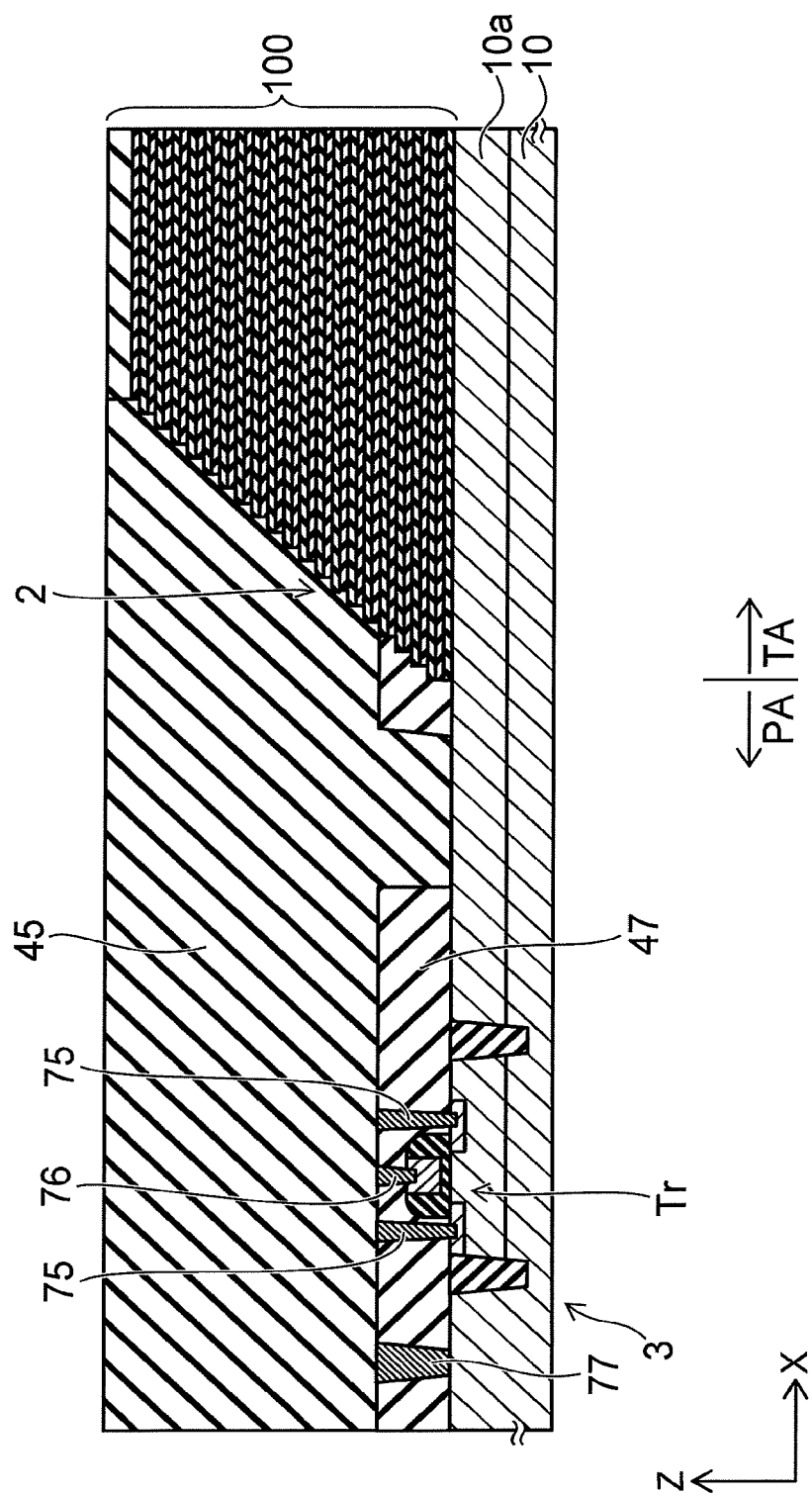

Subsequently, as shown in FIG. 24, the staircase portion 2 is formed in a portion of the stacked body 100. For example, a not-illustrated resist film is formed on the stacked body 100; and the second layer 72 and the first layer 71 in the region exposed from the resist film are removed from above by etching one layer at a time. A process (a slimming process) of causing the end of the resist film to recede in the X-direction and a process of etching the second layer 72 and the first layer 71 in the region exposed from the resist film one layer at a time from above are multiply repeated; thereby, a portion of the stacked body 100 is patterned into a staircase configuration.

A portion of the insulating layer 45 also may be etched when forming the staircase portion 2. The insulating layer 45 is formed on the staircase portion 2 and in the portion where the insulating layer 45 is removed.

After forming the insulating layer 45, the columnar portions CL are formed in the stacked body 100 of the memory region MA; and subsequently, the slits ST are formed in the insulating layer 45 on the stacked body 100 and the staircase portion 2.

Figure 25:
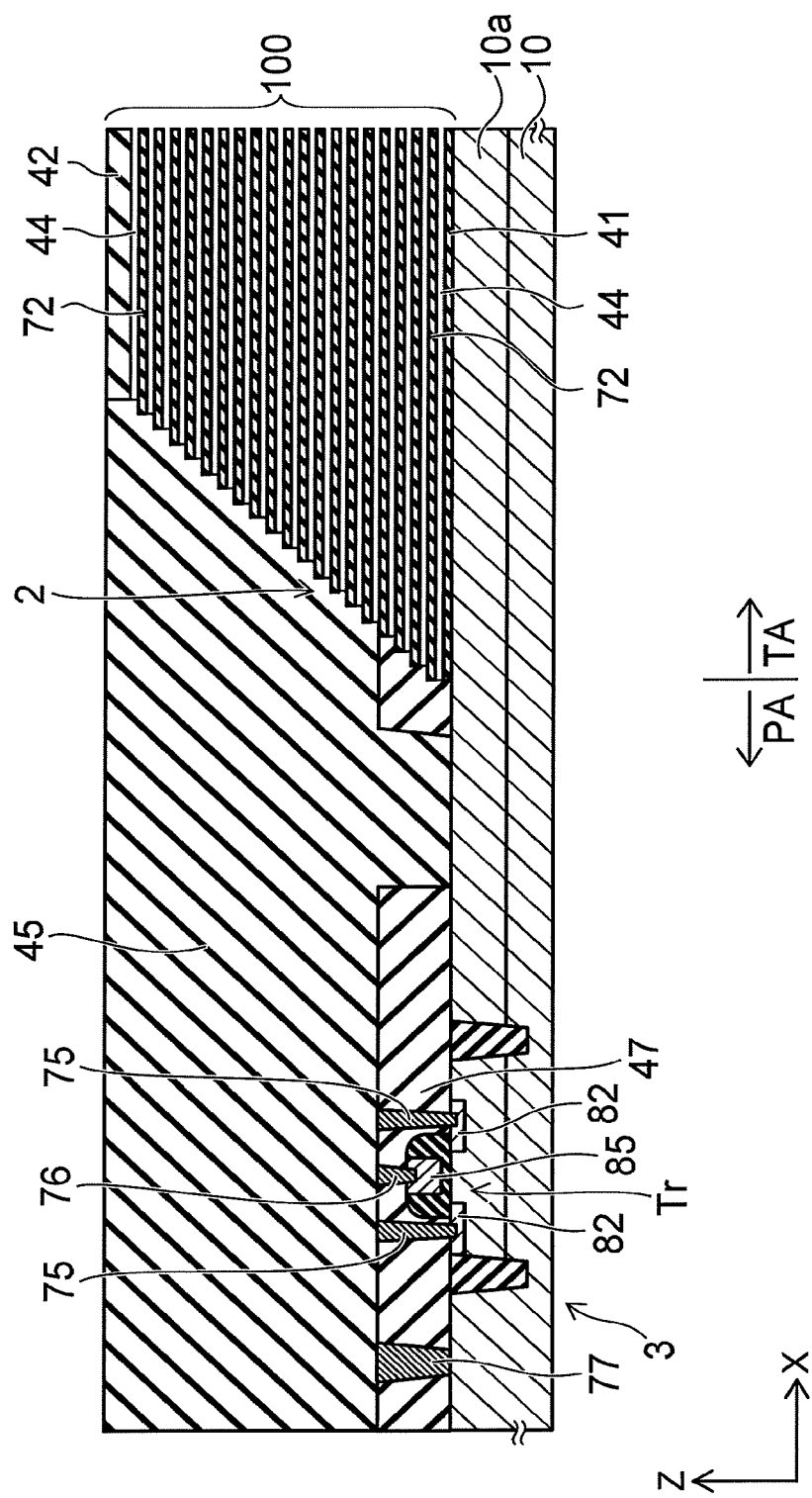

After forming the slits ST, the first layers 71 of the stacked body 100 are removed using, for example, an etchant including phosphoric acid supplied via the slits ST as described above. The first layers 71 are removed; and the gap 44 is formed in the stacked body 100 as shown in FIG. 25.

Figure 26:
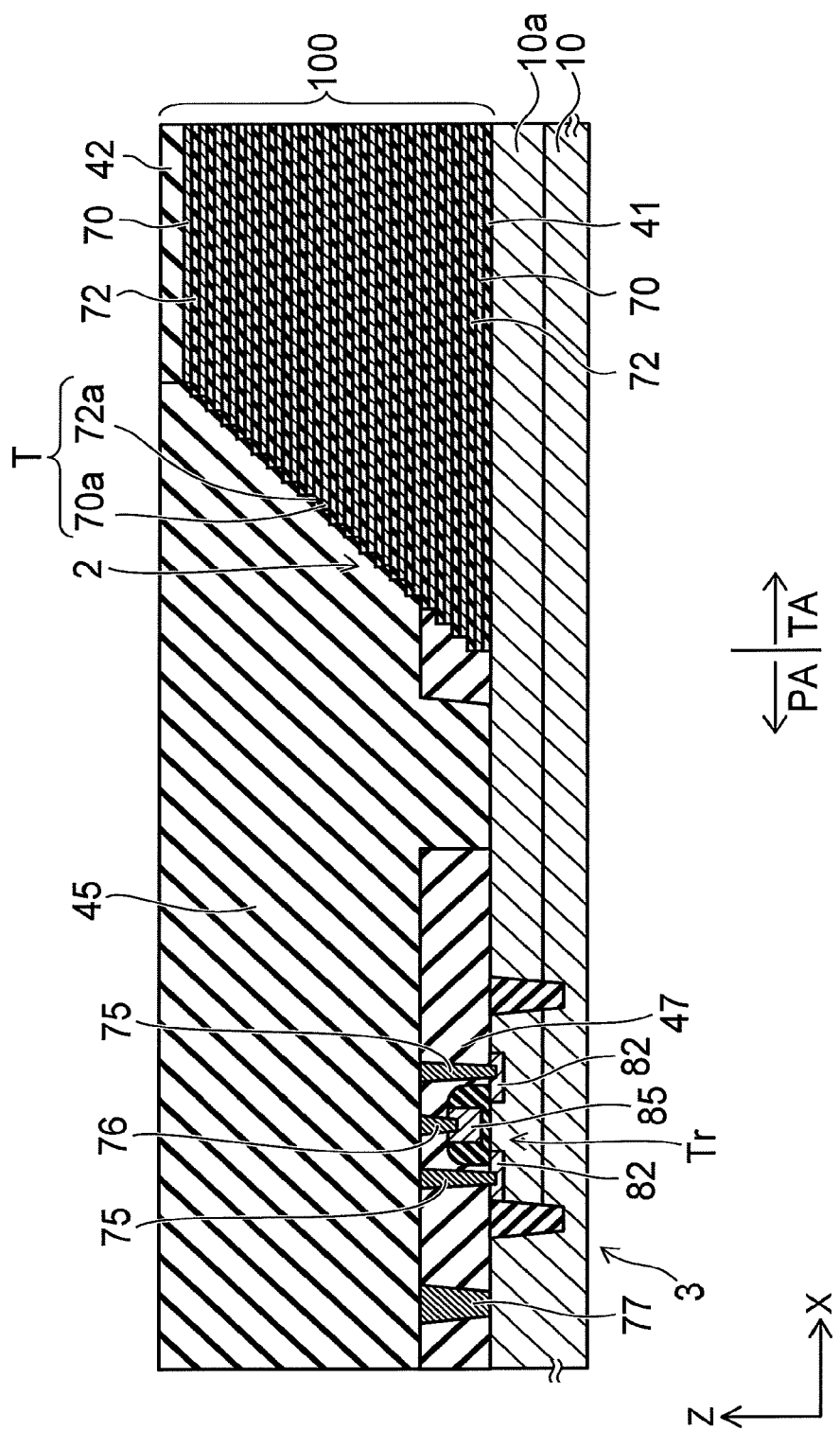

As shown in FIG. 26, the metal layers 70 are formed in the gap 44. Subsequently, the interconnect portion LI is formed, with the insulating film 63 interposed, inside the slit ST.

Figure 27:
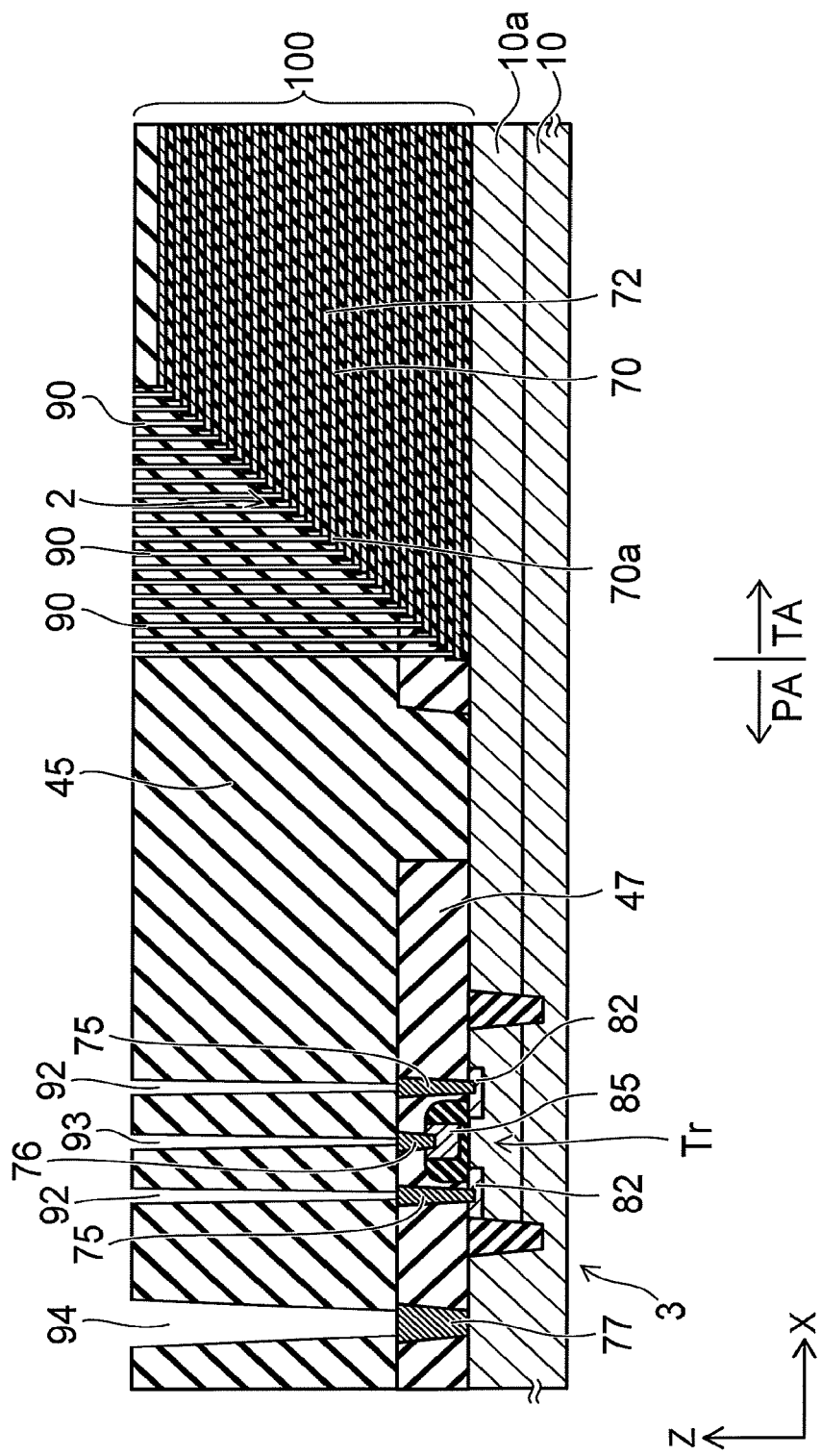

As shown in FIG. 27, multiple contact holes 90, 92, and 93 and a trench 94 are formed in the insulating layer 45 of the terrace region TA and the peripheral region PA. The contact holes 90, 92, and 93 and the trench 94 are formed simultaneously by RIE using a not-illustrated mask layer.

The contact holes 90 pierce the insulating layer 45 and are connected to the terrace portions 70a of the metal layers 70. The contact holes 92 pierce the insulating layer 45 and are connected to the contacts 75. The contact hole 93 pierces the insulating layer 45 and is connected to the contact 76.

The trench 94 pierces the insulating layer 45 and is connected to the edge seal portion 77. The trench 94 continuously surrounds the memory region MA, the terrace region TA, and the region where the transistor Tr is formed.

The depth-direction size of the trench 94 is larger than the depth-direction size of the trench filled with the edge seal portion 77. The width of the trench filled with the edge seal portion 77 is larger than the diameter of the contact hole filled with the contact 75 and the diameter of the contact hole filled with the contact 76. The width of the trench 94 is larger than the diameter of the contact hole 92 and the diameter of the contact hole 93.

A metal material is formed inside the contact holes 90, 92, and 93 and the trench 94. Thereby, as shown in FIG. 4, the contacts 91, 95, and 96 and the edge seal portion 97 are formed inside the insulating layer 45. The contacts 91, 95, and 96 and the edge seal portion 97 include, for example, tungsten as a major component.

According to the embodiment, the metal layers 70, the contacts 75 and 76, and the edge seal portion 77 which are metal are used as etching stoppers when collectively forming the contact holes 90, 92, and 93 and the trench 94. The metal layers 70, the contacts 75 and 76, and the edge seal portion 77 are the same type of metal and are, for example, a metal including tungsten as a major component. For example, such metal layers 70, such contacts 75 and 76, and such an edge seal portion 77 are used as stoppers when using a fluorine-based gas to perform RIE of the insulating layer 45 which is a silicon oxide layer.

Accordingly, the contact holes 92 and 93 for the transistor Tr can be patterned by high-power RIE simultaneously with the contact holes 90 for the metal layers 70 without damaging the substrate 10 in the region where the transistor Tr is formed or the components of the transistor Tr and without the contact holes 90 extending through the metal layers 70. This reduces the processing cost compared to the case where the contact holes for the transistor Tr and the contact holes for the metal layers 70 are formed by separate processes.

The metal layers 70, the contacts 75 and 76, and the edge seal portion 77 may not be of the same type of metal; and it is sufficient to use metals having selectivity when etching the insulating layer 45.

As a comparative example, the contact holes that pierce the insulating layer 45 and the insulating layer 47 have extremely high aspect ratios in the case where the contact holes are formed by performing RIE once to reach the semiconductor regions 82 of the transistor Tr.

In the case of RIE of a contact hole having a high aspect ratio, mainly ions reach the bottom of the contact hole; and the semiconductor regions 82 and the gate electrode 85 exposed at the bottom of the contact hole are easily charged to be positive. This may generate a potential difference between the charged portions and cause dielectric breakdown of the transistor Tr due to a so-called shading effect.

According to the embodiment, the contact holes 105 and 106 are formed in the insulating layer 47 as shown in FIG. 18 in the state before the thick insulating layer 45 is formed. Not only ions but also electrons reach the bottoms of the shallow contact holes 105 and 106; and the charge polarity at the hole bottoms is neutralized. Accordingly, the dielectric breakdown of the transistor Tr due to the shading effect can be prevented.

The edge seal portions 77 and 97 protect the chip by preventing ion penetration into the regions on the inner side of the edge seal portions 77 and 97 when dicing. The edge seal portions are obtained by filling a metal material into trenches having widths larger than the diameters of the contact holes.

In the case where a trench having a high aspect ratio is formed by RIE simultaneously with the contact holes, there are cases where a film of a material different from the etching object is deposited on the bottom of the trench; and the etching of the trench does not progress easily compared to the contact holes.

If the edge seal portion does not reach the substrate, the penetration of ions or the like is undesirably allowed into the chip region through the region between the substrate and the lower end of the edge seal portion when dicing. Also, in the case where the etching conditions are set so that the trench for the edge seal portion reaches the substrate, there is a risk that the etching of the contact holes may progress excessively.

According to the embodiment, the shallow trench 107 is formed as shown in FIG. 18 in the state before the thick insulating layer 45 is formed. Therefore, the deposits on the bottom of the trench 107 are suppressed; and the edge seal portion that reliably reaches the substrate 10 can be formed.

Although the sacrificial layers 71 are replaced with the metal layers 70 in the embodiment described above, the stacked body 100 may be formed by alternately stacking the metal layers 70 and the insulating layers 72 without forming the sacrificial layers 71.

Also, the insulating layers 72 may be removed by etching via a slit ST; and the region between the metal layers 70 adjacent to each other above and below may be a gap.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A method for manufacturing a semiconductor device, comprising:
    forming a transistor in a second region of a substrate, the substrate including a first region and the second region, the second region being at a periphery of the first region, and the transistor including an active region and a gate electrode;
    forming a first insulating layer on the second region, the first insulating layer covering the transistor;
    forming a plurality of first holes piercing the first insulating layer, and reaching the active region and the gate electrode;
    forming a first metal material inside the first holes;
    forming a plurality of metal layers on the first region, the metal layers being stacked with an insulator interposed, and the metal layers including a plurality of terrace portions arranged in a staircase configuration with a level difference;
    forming a second insulating layer on the first insulating layer and on the terrace portions;
    simultaneously forming a second hole and a plurality of third holes piercing the second insulating layer, the second hole reaching the first metal material inside the first holes, the first metal material being exposed at a bottom of the second hole, and the third holes reaching the terrace portions; and
    forming a second metal material inside the second hole and inside the third holes, the second metal material inside the second hole being connected to the first metal material inside the first holes, and the second metal material inside the third holes being connected to the terrace portions of the metal layers.

2. The method according to claim 1, wherein the first metal material and the metal layer include tungsten as the major component.

3. The method according to claim 1, wherein a length of one of the first holes is shorter than a length of the second hole.

4. The method according to claim 1, wherein a length of the first metal material is greater than a thickness of one layer of the metal layers.

5. The method according to claim 1, wherein
    a stacked body is formed on the first region, the stacked body including a plurality of first layers and a plurality of second layers, the first layers and the second layers including a first layer and a second layer stacked alternately,
    the first layers form, in a portion of the stacked body, the terrace portions arranged in the staircase configuration with the level difference, and
    the first layers are replaced with the metal layers after the forming of the second insulating layer on the terrace portions of the first layers.

6. A method for manufacturing a semiconductor device, comprising:
    forming a transistor in a second region of a substrate, the substrate including a first region, the second region, and a third region, the second region being at a periphery of the first region, the third region being at a periphery of the second region, and the transistor including an active region and a gate electrode;
    forming a first insulating layer on the second region and on the third region, the first insulating layer covering the transistor;
    forming a plurality of first holes and a first trench piercing the first insulating layer, the first holes reaching the active region and the gate electrode, and the first trench reaching at least a surface of the substrate in the third region;

forming a first metal material inside the first holes;

forming a second metal material inside the first trench;

forming a plurality of metal layers on the first region, the metal layers being stacked with an insulator interposed, and the metal layers including a plurality of terrace portions arranged in a staircase configuration with a level difference;

forming a second insulating layer on the first insulating layer and on the terrace portions;

simultaneously forming a second hole, a second trench, and third holes piercing the second insulating layer, the second hole reaching the first metal material inside the first holes, the first metal material being exposed at a bottom of the second hole, the second trench reaching the second metal material, and the third holes reaching the terrace portions; and forming a third metal material inside the second hole, inside the second trench, and inside the third holes, the third metal material inside the second hole being connected to the first metal material inside the first holes, the third metal material inside the second trench being connected to the second metal material inside the first trench, and the third metal material inside the third holes being connected to the terrace portions of the metal layers.

7. The method according to claim 6, wherein the first metal material, the second metal material, and the metal layers include tungsten as the major component.

8. The method according to claim 6, wherein a length of one of the first holes is shorter than a length of the second hole.

9. The method according to claim 6, wherein a length of the first metal material is greater than a thickness of one layer of the metal layers.

10. The method according to claim 6, wherein a depth-direction size of the first trench is smaller than a depth-direction size of the second trench.

11. The method according to claim 6, wherein
a width of the first trench is larger than a diameter of one of the first holes, and
a width of the second trench is larger than a diameter of the second hole.

12. The method according to claim 6, wherein the first trench and the second trench continuously surround a periphery of the second region.

13. The method according to claim 6, wherein
a stacked body is formed on the first region, the stacked body including a plurality of first layers and a plurality of second layers, the first layers and the second layers including a first layer and a second layer stacked alternately,
the first layers form, in a portion of the stacked body, the terrace portions arranged in the staircase configuration with the level difference, and
the first layers are replaced with the metal layers after the forming of the second insulating layer on the terrace portions of the first layers.

* * * * *